United States Patent [19]

Tanaka

[11] Patent Number: 5,747,202
[45] Date of Patent: May 5, 1998

[54] PROJECTION EXPOSURE METHOD

[75] Inventor: Hiroshi Tanaka, Utsunomiya, Japan

[73] Assignee: Canon Kabushiki Kaisha, Tokyo, Japan

[21] Appl. No.: 927,261

[22] Filed: Sep. 11, 1997

Related U.S. Application Data

[63] Continuation of Ser. No. 584,706, Jan. 11, 1996, abandoned, which is a continuation of Ser. No. 253,071, Jun. 2, 1994, abandoned.

[30] Foreign Application Priority Data

Jun. 7, 1993 [JP] Japan ................... 5-163151

[51] Int. Cl.$^6$ .................. C03C 5/02; G01B 11/03
[52] U.S. Cl. .................. 430/30; 430/394; 430/396; 356/401; 355/53; 355/55
[58] Field of Search .................. 430/30, 394, 396; 356/401; 355/53, 55

[56] References Cited

U.S. PATENT DOCUMENTS

| | | | |
|---|---|---|---|
| 4,908,656 | 3/1990 | Suwa et al. | 356/401 X |
| 4,999,669 | 3/1991 | Sakamoto et al. | 355/53 |
| 5,117,254 | 5/1992 | Kawashima et al. | 355/53 X |
| 5,124,927 | 6/1992 | Hopewell et al. | 356/401 X |
| 5,249,016 | 9/1993 | Tanaka | 362/108 |

*Primary Examiner*—Bernard P. Codd
*Attorney, Agent, or Firm*—Fitzpatrick, Cella, Harper & Scinto

[57] ABSTRACT

A method for manufacturing semiconductor devices includes the steps of exposing a pattern for focus measurement, formed on a surface of a reticle and comprising a two-dimensional grid pattern, to radiation and projecting the pattern for focus measurement onto a plurality of regions of an inspection wafer, on which a resist has been coated by a resist coating apparatus, using a projection exposure apparatus; developing the pattern for focus measurement projected on the inspection wafer with a developing apparatus; measuring the developed pattern for focus measurement on a plurality of regions of the inspection wafer with the projection exposure apparatus to obtain the focus position and the inclination of the plane of projection of the image of the pattern for focus measurement of the reticle, and setting the focus position and the inclination of the plane of projection in the projection exposure apparatus as a focus offset and an amount of correction of the inclination of the plane of projection; and coating the surface of the wafer with resist using the resist coating apparatus, exposing a pattern formed on the surface of the reticle to radiation and projecting the pattern onto the resist on the surface of the wafer using the projection exposure apparatus and using the set focus offset and the set amount of correction, and developing the resist using the developing apparatus.

7 Claims, 16 Drawing Sheets

FIG.11
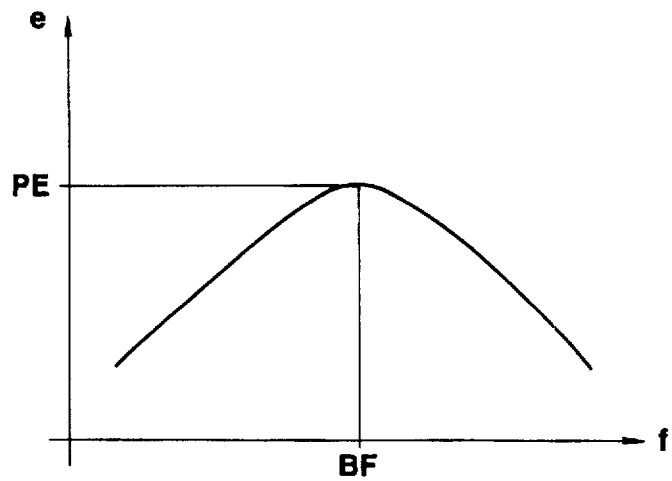
FIG.12(a)   FIG.12(c)
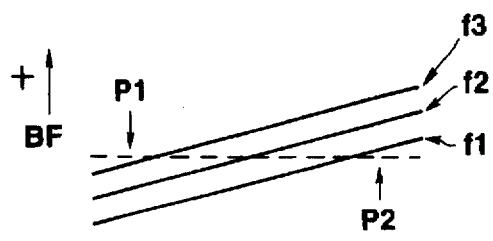   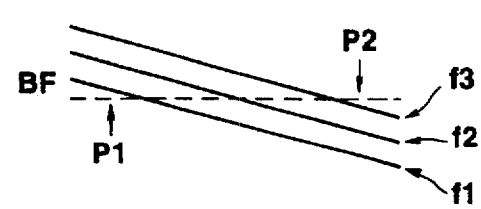
FIG.12(b)   FIG.12(d)
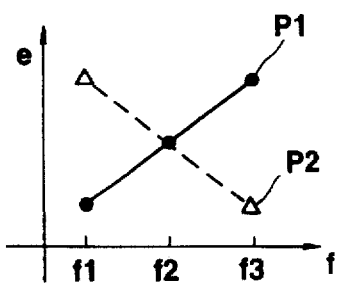   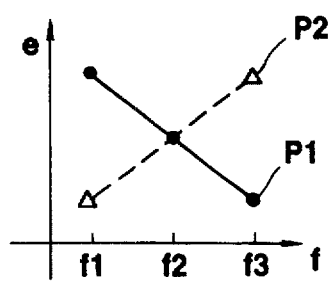

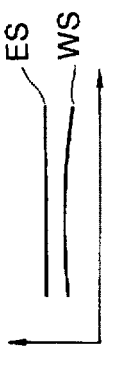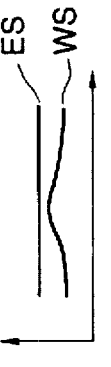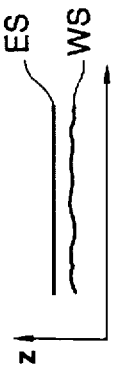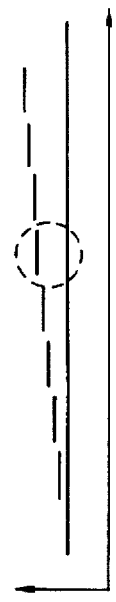

PROJECTION EXPOSURE METHOD

This application is a continuation of application Ser. No. 08/584,706 filed Jan. 11, 1996, which is a continuation of application Ser. No. 08/253,071 filed Jun. 2, 1994, both of which are now abandoned.

BACKGROUND OF THE INVENTION

1. Field of the Invention

This invention relates to a projection exposure method for manufacturing integrated circuits (semiconductor devices), and a semiconductor device manufacturing method using the same. The invention is particularly suitable when the amount of correction of a focus sensor in a focusing operation of a reticle on a wafer is measured, a very precise projection image of a pattern formed on the reticle is obtained, and semiconductor devices of high integration are manufactured.

2. Description of the Related Art

In a pattern exposure process of conventional semiconductor device manufacturing processes, a pattern on a reticle is exposed to radiation and projected onto a wafer. This pattern exposure process is performed while performing the alignment of the wafer with the reticle or without performing the alignment. Since current semiconductor device manufacturing techniques have moved toward printing patterns at a high density, the resolving power of projection lenses for projection exposure has-increased.

However, in accordance with the increase in the resolving power of projection lenses, the margin for error in performing a focusing operation is reduced, so that a more precise focusing operation for exposure is required. While it is only necessary to adjust the distance between a projection lens and a wafer in a conventional focusing operation, it also becomes necessary to adjust the defocus caused by the inclination of the wafer.

Conventionally, the correctness of a focus sensor (i.e., focus position detection means) incorporated in an exposure apparatus is inspected in the following manner. That is, first, an inspection pattern (chart) formed on a reticle is exposed to radiation and projected on a wafer coated with a resist using a focus value assigned by the exposure apparatus. At that time, the focus value is systematically changed such that it is sequentially increased or decreased. The exposed wafer is then developed to form a resist image of the inspection pattern. The inspection operator finds the best resist image of the inspection pattern using a microscope or the like, and the best focus position is determined from the focus value when the pattern corresponding to the best resist image has been exposed.

The best resist image indicates, for example, a resist image in which the finest line is resolved, or a resist image in which the width of the line equals the width of the space.

As described above, a focused state is currently inspected visually by the inspection operator. Whether an exposure region is inclined is also checked by visually inspecting a plurality of inspection marks within a region which can be exposed by the projection lens at one time. For the inspection, leading one or two wafers, called advanced wafers, selected from one lot comprising several tens to several hundreds of wafers, are usually used. The operator performs all the processes of resist coating, exposure, development, and visual inspection for the advanced wafers. After confirming the results of the inspection, the operator inputs the results to the exposure apparatus, and the remaining wafers are input to the line of the manufacturing process.

Among methods for detecting the focus position by a focus sensor used in an exposure apparatus, there are an air method which uses air, and an optical method which uses light. In the air method, the size of the distal end of the sensor cannot be reduced. Accordingly, it is difficult to finely measure the inclination and the shape of the above-described exposure region, and therefore the accuracy in the control of the inclination is not optimal. In the optical method, the position on a wafer coated with a semi-transparent resist is measured by projecting light onto the resist. Hence, the result of measurement tends to be influenced by light reflected by the surface of the wafer after entering the resist, in addition to light reflected by the surface of the resist. Furthermore, for example, the reflectivity of the wafer differs depending on the position on the wafer irradiated by the light, thereby causing an error in the measured value of the sensor.

In order to remove these disadvantages, and to provide a measured value of the focus sensor which is closer to the real value as much as possible, a method can be used in which an autofocus sensor is used, along with means for correcting the measured value by estimating an error by repeating measurement or by performing measurement while finely moving measured points.

This correction method is performed based on the following concept. That is, the exposure region comprises a plane. Hence, if the plane is measured by performing statistic processing while finely moving measured positions of the wafer, an error in the measurement of the focus sensor at an ordinary measured position can be obtained. In this case, an error of the focus sensor due to differences in the reflectivity of the wafer can be exactly obtained.

However, the influence of light entering the resist cannot be completely removed from the statistically obtained absolute value of the plane even in the measurement performed using the above-described optical focus sensor. For example, the maximum value of the final error reaches, in some cases, about 0.5 μm. Accordingly, the error in the measurement performed using a focus sensor cannot be removed if error correction is performed using the sensor itself. In order to determine such an error, it is necessary to visually inspect a wafer, which has actually been exposed and developed, according to the above-described method. That is, an error of a focus sensor incorporated in an exposure apparatus must still be corrected by visual inspection, and cannot be corrected by the exposure apparatus by itself.

On the other hand, a long time is required for visual inspection, so that the production line must be stopped for a long time, thereby causing a decrease in the production efficiency. In addition, when the amount of inspection increases, error in measurement is produced due to the fatigue of the operator. Furthermore, if the inspection operator changes, great differences arise in the result of the visual inspection. With current LSI (large-scale integrated circuit) manufacturing techniques, the production yield is reduced even if a difference of 0.5 μm arises in the result of inspection of a focused state, and an erroneous value is input to the exposure apparatus as a focus offset.

In the current inspection method, the efficiency of inspection and the accuracy in inspection are degraded from the viewpoint of controlling the best focus for every wafer process in the manufacture of semiconductor devices. Accordingly, it is necessary to provide a high-speed inspection apparatus having stable accuracy in measurement.

Recently, in order to remove the above-described disadvantages in visual inspection, a dedicated apparatus, which can automatically measure the line width of a resist pattern developed after exposure, has been utilized. For example, a scanning electron microscope (SEM) having a length-measuring function is used. This apparatus is currently used in an off-line state, i.e., in a state separated from an exposure apparatus for manufacturing semiconductor devices. A wafer exposed by the exposure apparatus is inspected after development by an inspection apparatus for automatic measurement.

However, the use of such a dedicated apparatus causes an increase in the area required for installing equipment, and an extreme increase in the production cost. For example, when obtaining optimum focus conditions from the measurement of the line width, an apparatus which can stably discriminate between 0.5 μm and 0.48 μm is very expensive and very large in size based on the current level of the fine processing technique. The same degree of accuracy is required for marks for measurement which do not depend on accuracy in measurement.

In addition, resists must be treated in a delicate manner, so that it is necessary to provide an environment in which optimum exposure can always be performed. Conditions of the current semiconductor device manufacturing technique greatly influence an exposure apparatus. Hence, a change in the environment of the exposure apparatus greatly influences the focused state. Accordingly, the inspection time must be minimized.

In practice, while the focus is automatically inspected by an SEM, or the like, using the above-described means, or visually inspected, and the result of the inspection is subjected to feedback to the exposure apparatus, the exposure apparatus is, in many cases, in a waiting state. However, a high-precision measuring mechanism for alignment, which can measure an inspection pattern for the focus, is incorporated in the exposure apparatus. Such waste decreases the efficiency of the entire system. If a coater and a developer are also included, an on-line inspection system can be constructed.

SUMMARY OF THE INVENTION

It is an object of the present invention to provide a projection exposure apparatus, in which by utilizing a detection mechanism of the exposure apparatus, the amount of correction of a focus sensor is very precisely detected, and a high-resolution pattern image is obtained, and to provide a semiconductor manufacturing apparatus which uses the above-described apparatus.

According to one aspect, the present invention which achieves these objectives relates to a method for manufacturing semiconductor devices comprising the steps of exposing a pattern for focus measurement, formed on a surface of a reticle and comprising a two-dimensional grid pattern, to radiation and projecting the pattern for focus measurement onto a plurality of regions of an inspection wafer, on which a resist has been coated by a resist coating apparatus, using a projection exposure apparatus. The method further comprises the step of developing the pattern for focus measurement projected on the inspection wafer with a developing apparatus. The method further comprises the step of measuring the developed pattern for focus measurement on a plurality of regions of the inspection wafer with the projection exposure apparatus to obtain the focus position and the inclination of the plane of projection of the image of the pattern for focus measurement of the reticle, and setting the focus position and the inclination of the plane of projection of the image of the pattern for focus measurement of the reticle in the projection exposure apparatus as a focus offset and an amount of correction of the inclination of the plane of projection. The method further comprises the steps of coating the surface of a wafer with resist using the resist coating apparatus, exposing a pattern formed on the surface of the reticle to radiation and projecting the pattern onto the resist on the surface of the wafer using the projection exposure apparatus and using the set focus offset and the amount of correction of the inclination of the plane of projection, and developing the resist using the developing apparatus.

According to another aspect, the present invention which achieves these objectives relates to a projection exposure method comprising the steps of forming an image of a mark on a surface of a reticle and forming an image of a mark on the surface of a wafer on a surface of image pickup means, aligning the reticle and the wafer relative to each other with an alignment mechanism using image information obtained from the image pickup means, exposing a plurality of patterns for focus measurement, each comprising a two-dimensional grid pattern, on the surface of the reticle to radiation and projecting an image of the plurality of patterns for focus measurement onto a resist coated on the aligned wafer, measuring the plurality of patterns for focus measurement provided on the surface of the wafer in the ex-posing and projecting step with an alignment mechanism, and determining a best focus position of the wafer and the inclination of the plane of projection of an image of the plurality of patterns for focus measurement of the reticle projected onto the wafer to form the plurality of patterns for focus measurement provided on the surface of the wafer based on a result of the measurement in the measuring step.

According to still another aspect, the present invention which achieves these objectives relates to a projection exposure method comprising the step of forming images of marks on a surface of a wafer on a surface of image pickup means. The method further comprises the steps of aligning the wafer and the image pickup means relative to each other with an alignment mechanism using image information obtained from the image pickup means, and exposing a plurality of patterns for focus measurement of a reticle, each comprising a two-dimensional grid pattern, to radiation and projecting an image of the plurality of patterns for focus measurement onto a resist coated on the surface of the aligned wafer. The method further comprises the steps of measuring the plurality of patterns for focus measurement provided on the surface of the wafer in the exposing and projecting step with the alignment mechanism, and determining a best focus position of the wafer and inclination of the plane of projection of an image of the plurality of patterns for focus measurement of the reticle projected onto the wafer to form the plurality of patterns for focus measurement provided on the surface of the wafer based on a result of the measurement in the measuring step.

The projection exposure apparatus of the present invention has features, for example, in that it includes a mechanism to switch light for illuminating the pattern for focus measurement between exposure light, which exposes the resist, and non-exposure light, which does not expose the resist, and in that it includes an autofocus mechanism for controlling the position of the wafer by detecting the best focus position from the sharpness of the pattern for focus measurement, provided on the surface of the wafer, on the surface of the image pickup means.

As described above, a resist coating apparatus (a coater), a projection exposure apparatus (a stepper), a developing apparatus (a developer), and the like are configured as a system. so as to provide high-speed and high-accuracy measurement of the amount of correction of a focus sensor. That is. the present invention provides a semiconductor manufacturing line configured by a coater, a developer, and a stepper having an exposure and inspection mechanism. Advanced wafers, serving as wafers for inspection, are fed from the coater to the stepper, and are exposed, and developed by the developer. Thereafter, the advanced wafers are sent to and inspected by the stepper. Hence, the entire inspection operation is automated.

In the present invention, the obtained measured values are compared with the values of the stepper during an exposure operation, and are automatically set in the stepper as an offset whenever necessary, so that a focus measuring method using image processing and capable of minimizing error in measurement is adopted.

BRIEF DESCRIPTION OF THE DRAWINGS

FIG. 11 is a graph illustrating the process to determine the best focus value in the present invention;

FIGS. 12(a) through 12(d) are schematic diagrams illustrating the step to determine the sign of a focus value in the present invention;

FIGS. 18(a) through 18(o) are schematic diagrams illustrating the relationship between undulation of a wafer and an exposure plane;

DESCRIPTION OF THE PREFERRED EMBODIMENTS

First, the outline of the present invention will be described followed by a description of an automatic inspection process. In the manufacture of semiconductor devices, in order to automate inspection of the exposure focus (the focus position) and the inclination of the exposure focus (the plane of projection) when exposing a wafer, a semiconductor device manufacturing apparatus configured by connecting a resist coating apparatus (a coater), a projection exposure apparatus (a stepper), a developing apparatus (a developer), and the like, in series is used.

Figure 1:
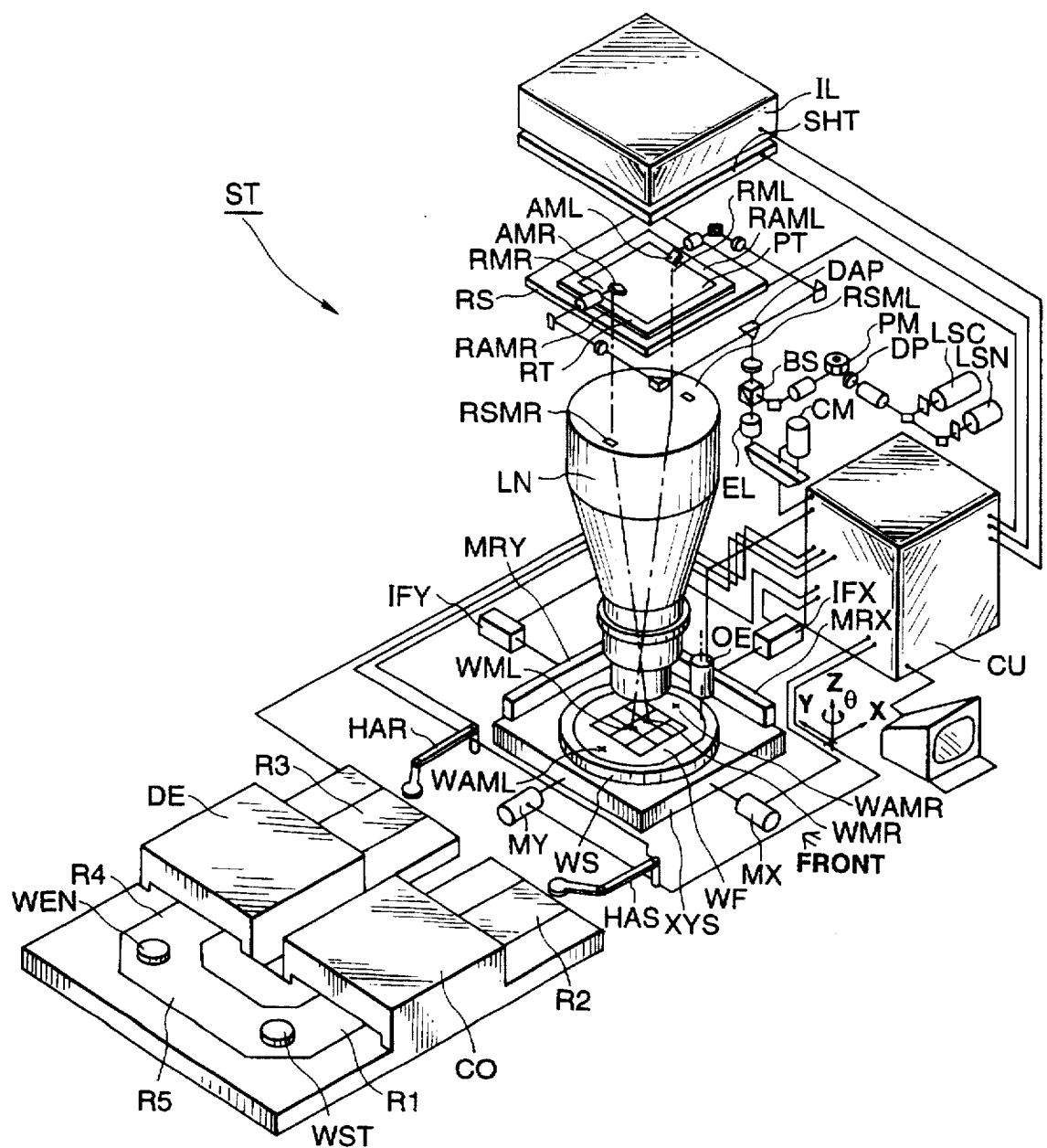
FIG. 1 is a schematic diagram illustrating the configuration of a principal portion of a semiconductor device manufacturing apparatus according to a first embodiment of the present invention.

FIG. 1 illustrates the external appearance of such an apparatus. In FIG. 1, a coater CO includes a mechanism to coat a resist on an inspection wafer. A stepper ST includes a mechanism to expose a pattern formed on a reticle to radiation and to project the pattern onto the inspection wafer, and a mechanism to measure inspection marks formed on the wafer. A developer DE includes a mechanism to develop the inspection wafer exposed by the stepper ST.

Automatic inspection is performed while passing the inspection wafer placed at the entrance of the coater CO through the respective mechanisms in response to instructions from a control unit CU. The focus value and the inclination of the plane of projection which have been measured are input to the stepper ST, and are used as exposure parameters for the production of wafers. The inspection wafer and the production wafers pass through the same process.

Figure 4:
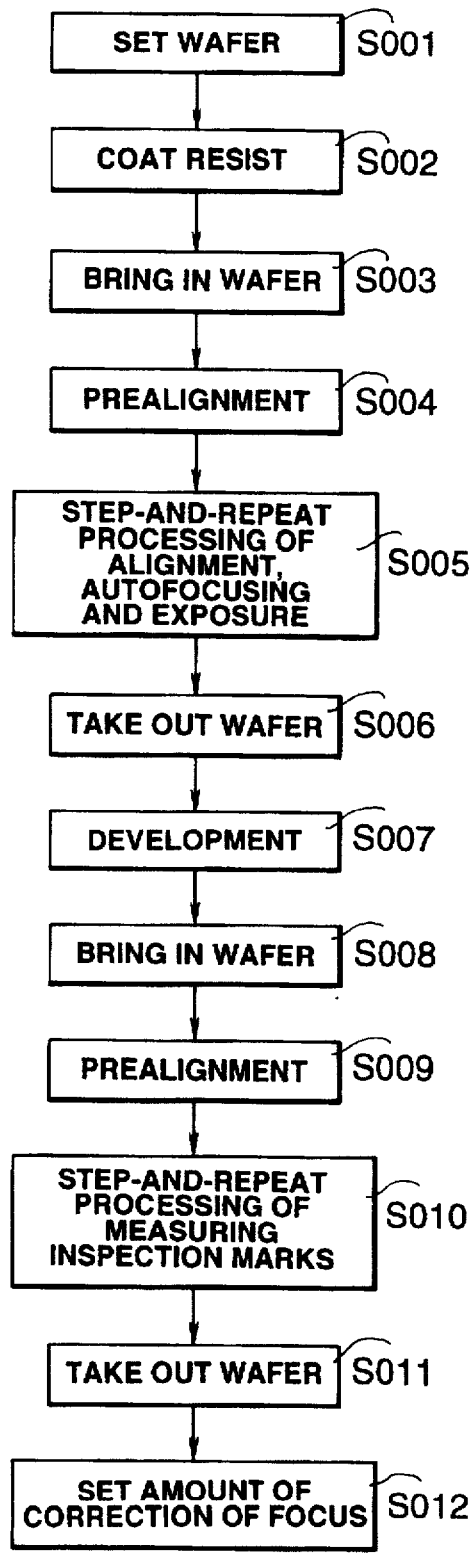
FIGS. 4 and 5 are flowcharts for a method of setting the amount of correction of the focus in the present invention.
Figure 5:
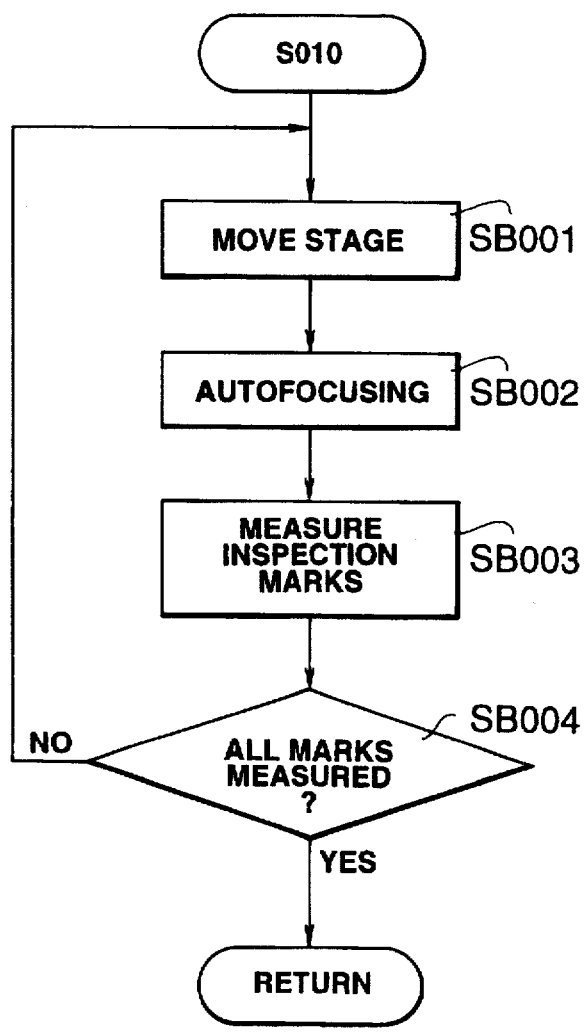
Figure 19:
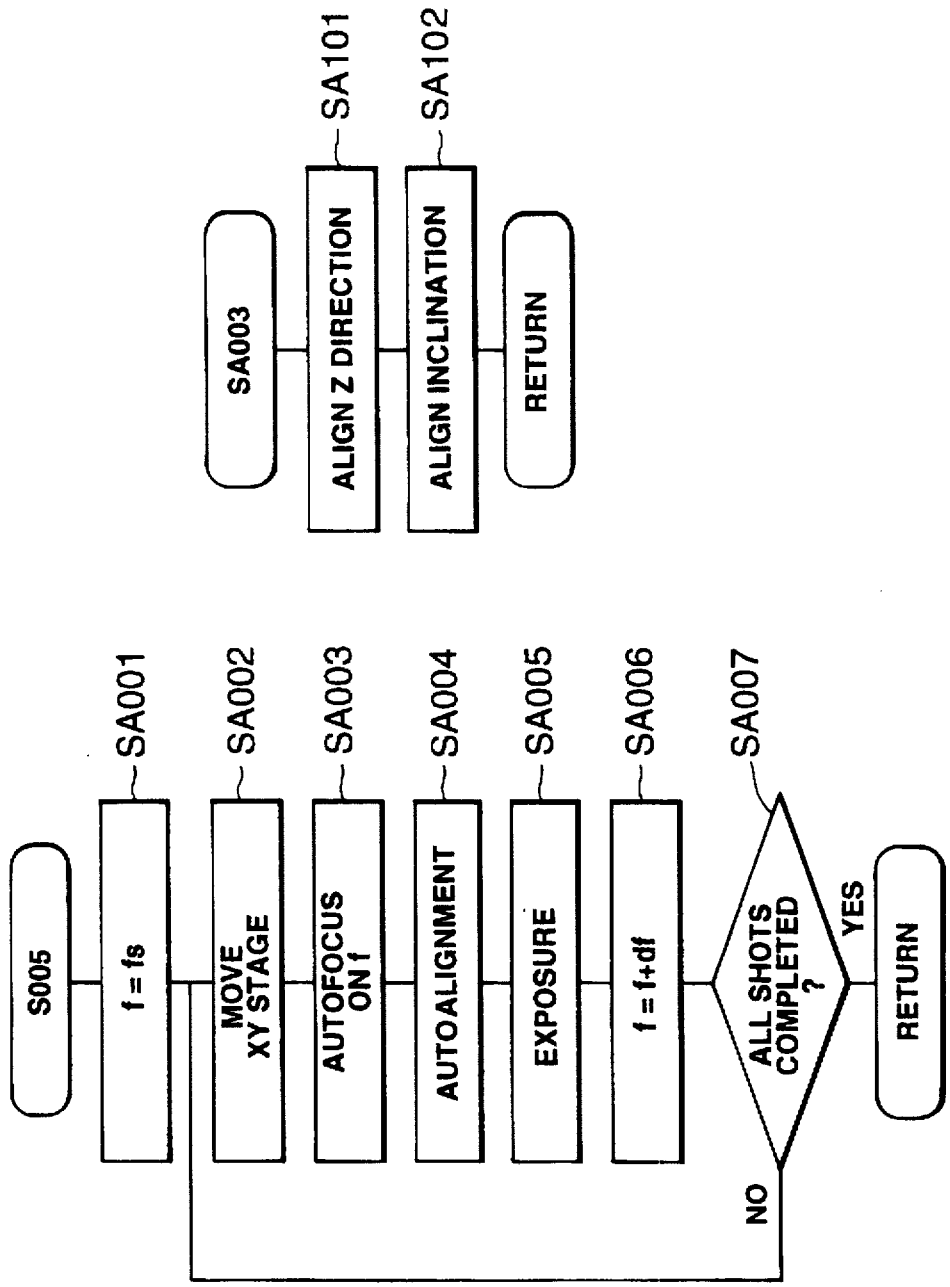
FIG. 19 is a flowchart illustrating step-and-repeat processing of a wafer for inspection.

Next, a description will be provided of the automatic inspection method according to the present invention with reference to FIGS. 4, 5 and 19.

In a first set of steps, a wafer WF to be inspected is placed on a wafer setting table WST (step S001). The wafer passes through a path R1, and a resist is coated on the wafer in the resist coater CO (step S002). The wafer then passes through a path R2 and is conveyed to the stepper ST (step S003). The wafer conveyed to the stepper ST is mounted on a wafer chuck WS provided on an XY stage XYS by an automatic hand HAS, and is subjected to vacuum suction.

In a second set of steps, a pattern depicted on a reticle RT is exposed to radiation and projected onto the resist coated on the wafer WF. A pattern region which is exposed at one time is generally called a shot. The reticle RT placed above a reduction projection lens LN is aligned using set marks RSML and RSMR provided on the upper surface of the projection lens LN, and reticle alignment marks RAMR and RAML cut on the reticle RT.

The position of the XY stage XYS is precisely measured by a laser interferometer, comprising a laser IFX and a mirror MRX in the x-axis direction, and a laser IFY and a mirror MRY in the y-axis direction. The XY stage XYS moves an arbitrary postion of the wafer WF under the projection lens LN by controlling the revolutions of motors MX and MY.

The positions of marks WAML and WAMR on the wafer WF mounted on the wafer chuck WS are measured by an off-axis optical system OE, and the position of the wafer WF on the XY stage XYS is aligned in a prealignment step (step S004). Next, alignment, autofocusing, and exposure operations are performed in a step-and-repeat manner (step S005). Specifically, the details of this step are shown in FIG. 19 in steps SA001–SA007. In step SA001 the first focus position, f, is set to fs. Next, in step SA002, the XY stage XYS moves so that the first shot is positioned under the projection lens LN, the distance between the wafer WF and the projection lens LN is adjusted to a set distance, and an autofocusing operation to correct the inclination of the focal plane is performed.

Figure 3:
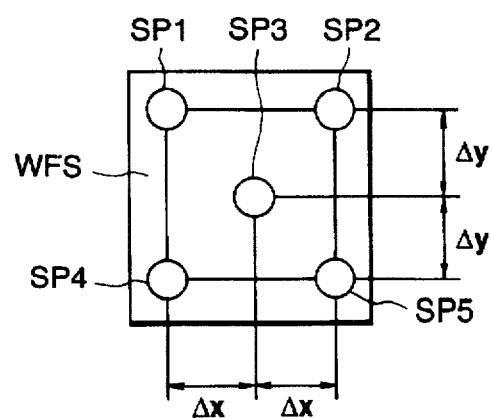

In the autofocusing operation, SA003, focus measuring points SP1, SP2, SP3, SP4 and SP5 shown in FIG. 3 are set on an exposure region WFS on the wafer WF, and the deviation of light spots illuminating the respective points are measured. The five points within the exposure region are measured in order to measure the inclination of the focal plane from differences among the heights of the respective points.

Figure 2:
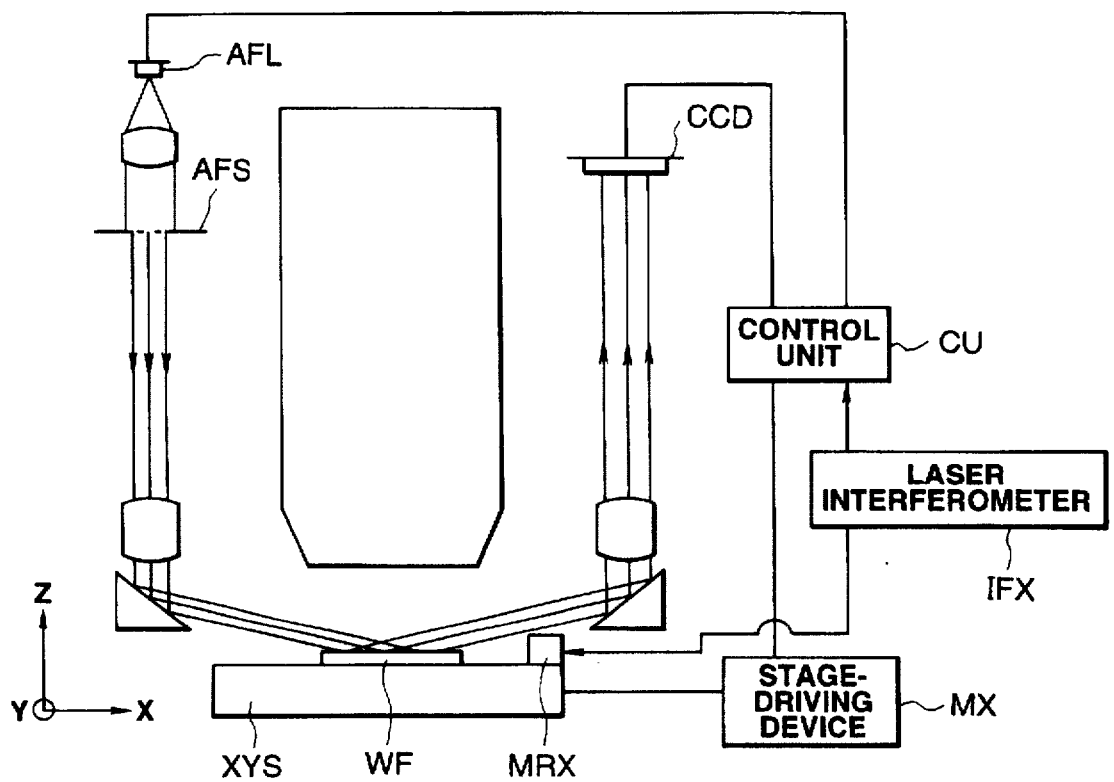
FIGS. 2 and 3 are schematic diagrams illustrating the configuration of an automatic focus measuring mechanism shown in FIG. 1.

As shown in FIG. 2, light emitted from a light source AFL is converted into a parallel light beam, which is divided into five light beams by a slit AFS. The five light beams obliquely illuminate the exposure region WFS. The light beams reflected by the exposure region WFS are imaged onto an image pickup device CCD (charge-coupled of device). The position of each light spot on the image pickup device CCD shifts in proportion to the height of the position of the corresponding light beam within the exposure region WFS. The control unit CU calculates the amount of shift of each light spot, calculates the focus and the amount of tilt of the XY stage XYS from the amounts of shift of the five light spots, drives a driving device (not shown) for the XY stage XYS based on the calculated values, and performs a focusing operation by aligning the XY stage XYS in the Z direction in step SA101 and by aligning the inclination of the stage XYS in step SA102.

After the autofocusing operation has been completed, alignment between the reticle RT and the wafer WF is performed (step SA004). Light emitted from He—Cd laser light sources LS (LSC and LSN) for alignment having a wavelength substantially equal to the wavelength of the exposure light is diffused by a diffusing plate DP to remove unevenness in illuminance, is then subjected to scanning by a polygonal mirror PM to magnify the illuminating region, and is divided toward right and left optical systems by a prism DAP.

In the left (right) optical system, the alignment light is projected onto the projection lens LN by an objective mirror AML (AMR) to illuminate an alignment mark WML (WMR) provided on the wafer WF. The image of the alignment mark WML (WMR) passes through the projection lens LN, passes through the objective mirror AML (AMR) and the prism DAP together with the image of an alignment mark RML (RMR) on the reticle RT, is magnified by an erector lens EL, and is focused onto the image pickup surface of a CCD camera CM. The right optical system has an identical function.

Figure 6:
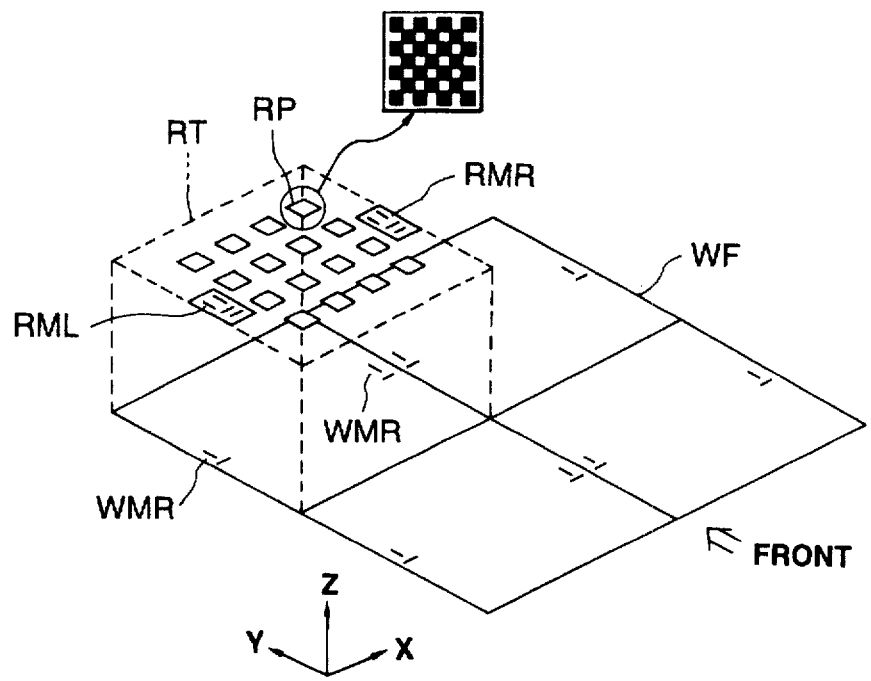
FIGS. 6 and 7 are schematic diagrams illustrating the relationship between a reticle and a wafer shown in FIG. 1.

The image is processed by the stepper control unit CU, and the amount of shift is calculated. Alignment is performed by finely driving a reticle stage RS on which the reticle RT is mounted. When the alignment has been completed, an exposure shutter SHT for printing an IC (integrated circuit) pattern formed on the reticle RT is simultaneously opened. The size of a light beam from an exposure light source IL projected onto a reticle pattern PT is reduced to ⅕ via the projection lens LN, and exposes the resist coated on the wafer WF. Thus, inspection marks RP are transferred onto the wafer WF. As shown in FIG. 6, a plurality of inspection marks RP are provided two-dimensionally on the reticle RT.

The inspection marks RP are provided two-dimensionally in order to measure the inclination of the plane of projection of an image of the inspection marks RP of the reticle, i.e., the inclination of the exposure region WFS. At that time, the focus during exposure is changed by changing the distance between the wafer chuck WS and the projection lens LN by vertical movement of the wafer chuck WS. When the exposure has been completed (step SA005), the focus is changed by df (step SA006) and the method determines whether all the shots are exposed (step SA007). If not, the method returns to step SA002 and the XY stage XYS moves to the next exposure position and steps SA002–SA007 are repeated. If the stepper control unit CU determines in step SA007 that all shots are exposed, the method returns to FIG. 4 and advances to step S006.

In order to inspect the amount of focus as will be described later, the amount of focus is changed stepwise when sequentially exposing the wafer (step SA006). This process is necessary for detecting the best focus in a process of inspecting the wafer WF which has been exposed in the above-described manner and developed by the developer DE.

Figure 16B:
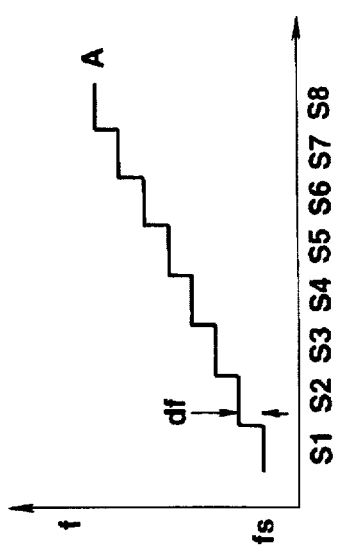
FIGS. 16(A) through 16(C) are schematic diagrams illustrating a method of exposing a wafer by continuously changing the focus one-dimensionally.
Figure 16C:
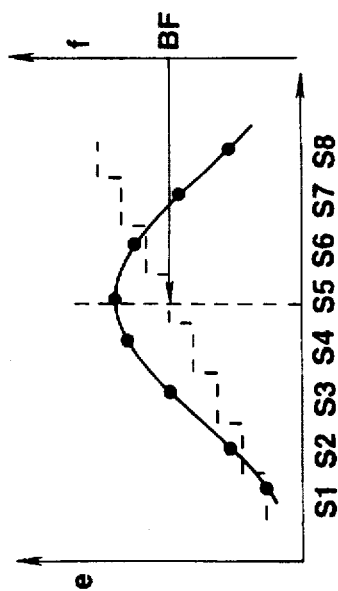
Figure 16A:
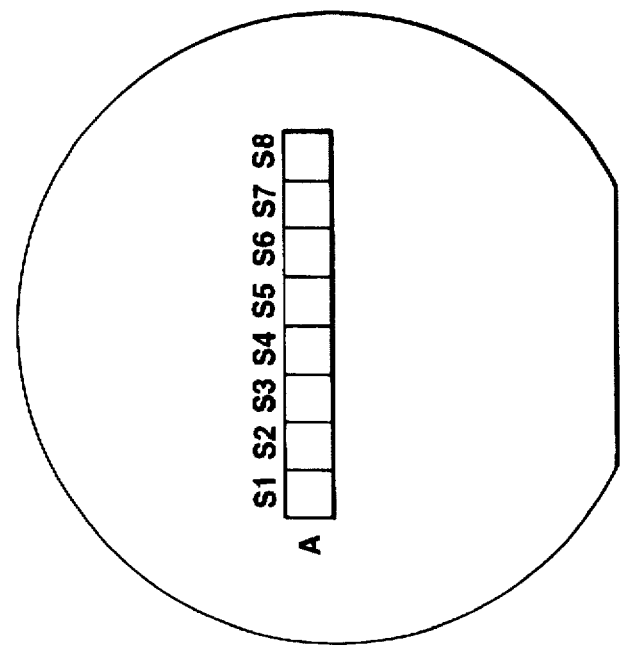
Figure 17B:
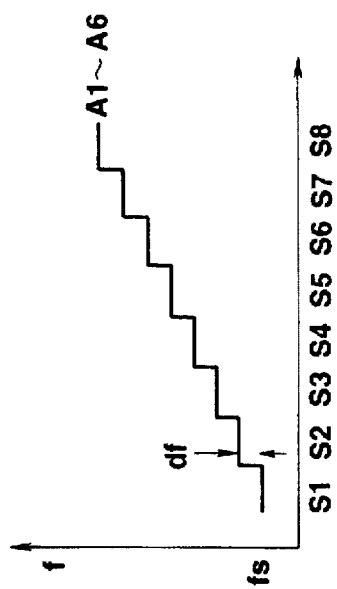
FIGS. 17(A) through 17(C) are schematic diagrams illustrating a method of exposing a wafer by continuously changing the focus two-dimensionally.
Figure 17C:
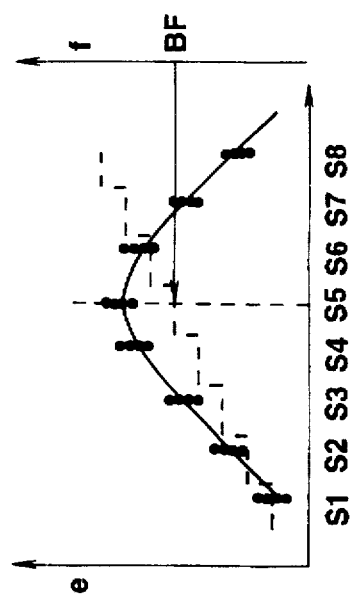
Figure 17A:
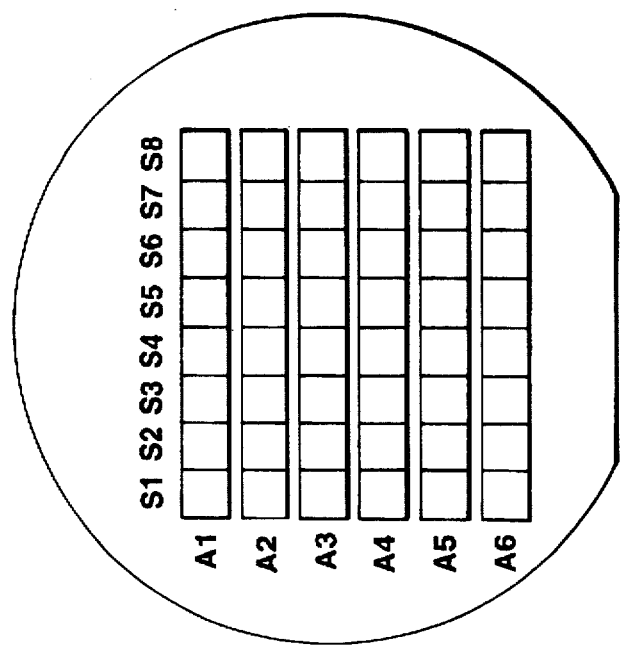

The amount of focus may be changed by changing the focus stepwise either one-dimensionally (see FIG. 16(A)), or two-dimensionally by repeating the above-described exposure at least twice (see FIG. 17(A)). More precise measurement can be performed by two-dimensionally exposing the wafer (to be described later).

FIG. 16(a), 16(b) and 16(c) show the method of changing the focus in one dimension. In FIG. 16(a) a plurality of exposure or shot areas S1 ... S8 in a row A are shown. These areas are aligned in the x-direction and are exposed in a step-and-repeat manner. In FIG. 16(b), the first focus position is represented by fs, and the amount of the subsequent change is represented by df. Accordingly, the first exposure of a shot performed at the focus fs corresponds to S1 shown in FIG. 16(a), and the subsequent exposure shots which change the focus by df at each shot correspond to S2, S3, . ... In other words, the focus at exposure are S1 is fs+df. FIG. 17(a) shows a plurality of exposure areas in two dimensions in columns S1 to S8 and rows A1 to A6. In the case of the two-dimensional exposure, since the one-dimensional exposure pattern is repeated a plurality of times, the same changes in the focus are provided for rows A1 through A6 in areas S1–S8 (see FIGS. 17(b) and 17(c)) and exposure shots in each of areas S1, S2, . . . shown in FIG. 17(c) correspond to shots for the rows A1, A2, A3, . . . .

Since the inclination of the wafer surface is adjusted by the stage at each exposure by an auto-focusing operation, the focal plane of the exposure light is always parallel to the exposure region even if the wafer is warped or undulated, as shown in FIGS. 18(a) through 18(o). Specifically this is seen in FIGS. 18(b) and 18(c), 18(e) and 18(f), 18(h) and 18(i), 18(k), and 18(l), and 18(n) and 18(o). FIGS. 18(c), 18(f), 18(i), 18(l) and 18(o) show in an enlarged manner the circular portions shown in FIGS. 18(b), 18(e), 18(h), 18(k) and 18(n), respectively. For example, the exposure surface ES of the wafer surface WS, which is flat as shown in FIG. 18(a), is always parallel to the corresponding portion of the wafer surface WS, even if the inclination of the wafer is not adjusted. This is seen in FIGS. 18(b) and 18(c). In the case of the wafer surface WS which has a warp shown in FIG. 18(d), the exposure surface ES can be parallel to the wafer surface WS by adjusting the inclination (see FIG. 18(f)). FIGS. 18(g), 18(j), and 18(m) show wafers which have large undulations, a plurality of small undulations, and fine projections and recesses, respectively. In each case, the focal plane of the exposure light is made to be parallel to the exposure region of the wafer by adjusting the inclination. This is seen in FIGS. 18(h), 18(i), 18(k), 18(l), 18(n), and 18(o).

Processing of repeating the movement of the stage, autofocusing, alignment, exposure, and the movement of the stage is called step-and-repeat processing (step S005). After the exposure of the entire wafer WF has been completed, the method advances from step SA007 to a third set of steps including step S006 in FIG. 4 in which the wafer WF is conveyed from the wafer chuck WS to a conveying path R3 of the developing unit DE using a recovery hand HAR.

Next in the third set of steps, the wafer WF conveyed to the path R3 is conveyed to the developing unit DE (step S007). The wafer WF, which has been developed by the developing unit DE, is conveyed to a path R5 after passing through a path R4, and the process proceeds to a fourth set of steps, which is an inspection process.

In the fourth set of steps, the wafer WF passes through the path R1 used in the first set of steps, is conveyed to the path R2 without being coated with the resist in the resist coater CO, and is mounted again on the wafer chuck WS using a supply hand HAS (step S008). The wafer WF is aligned in a prealignment step by the off-axis optical system OE (step S009). In the fourth set of steps, inspection is performed using the inspection marks obtained by exposing the wafer WF by changing the focus in the second step (step S010). The details of step S010 are shown in FIG. 5.

Figure 7:
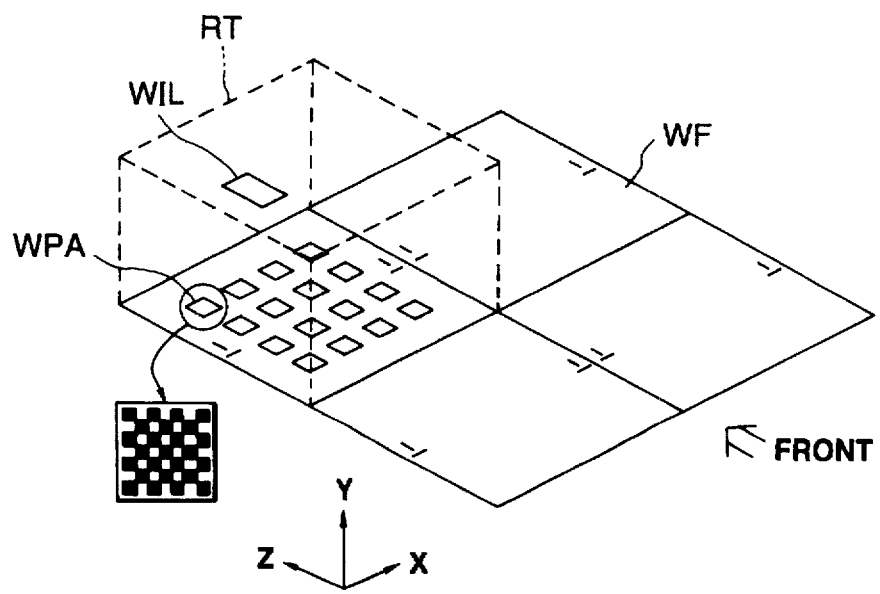
Figure 9:
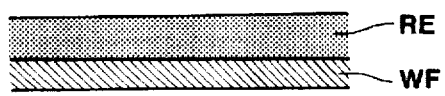
FIGS. 9(a) and 9(b) cross-sectional views of the wafer and a resist coating thereon.
FIGS. 9(c) and 9(f) are schematic top views of the wafer as imaged by a CCD camera CM.
FIGS. 9(d) and 9(g) are differential images of the wafer shown in FIGS. 9(c) and 9(f), respectively.
FIGS. 9(e) and 9(h) are histograms of FIGS. 9(d) and 9(g), respectively.
Figure 9:
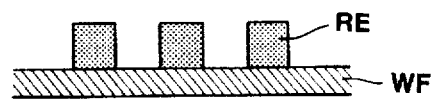
Figure 9:
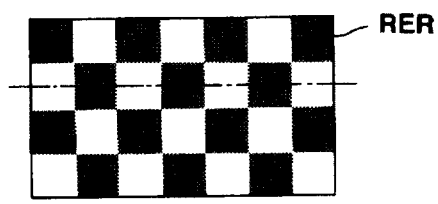
Figure 9:
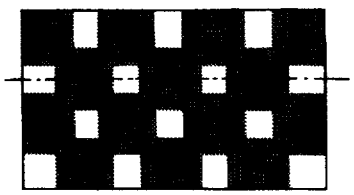
Figure 9:
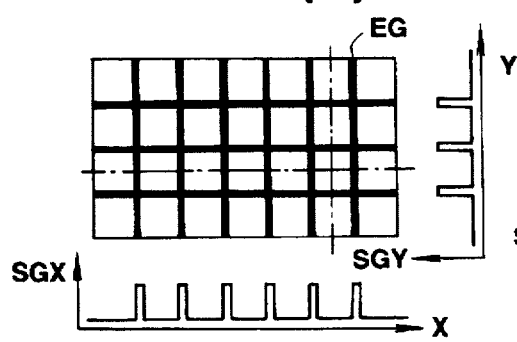
Figure 9:
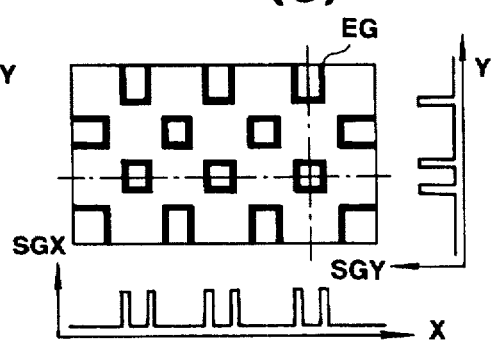
Figure 9:
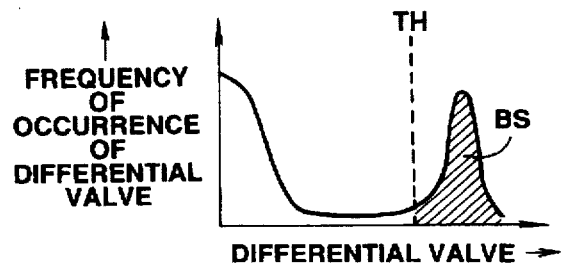
Figure 9:
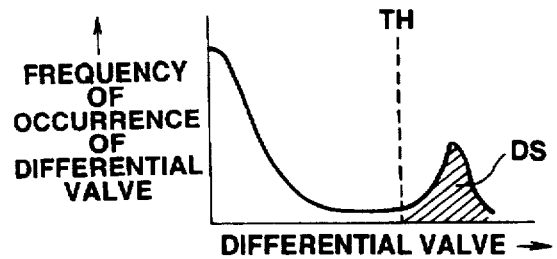
Figure 10:
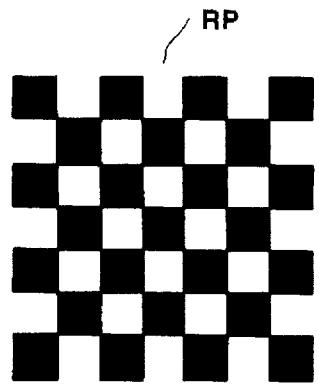
FIG. 10(a) is a schematic top view of the reticle pattern RP.
FIGS. 10(b), 10(c), 10(d), 10(e) and 10(f) are schematic top views of the image WPA of the inspection mark.
Figure 10:
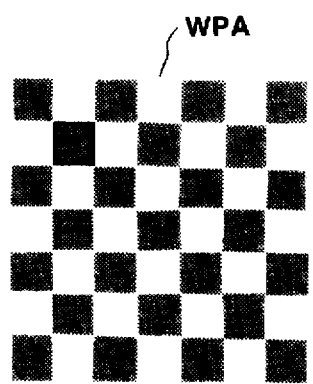
Figure 10:
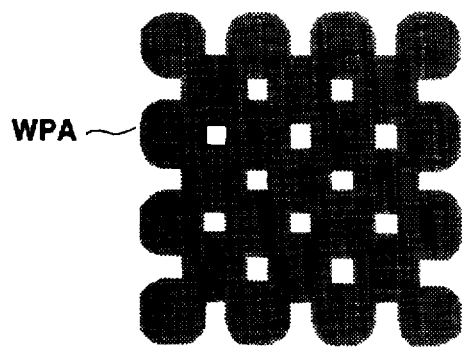
Figure 10:
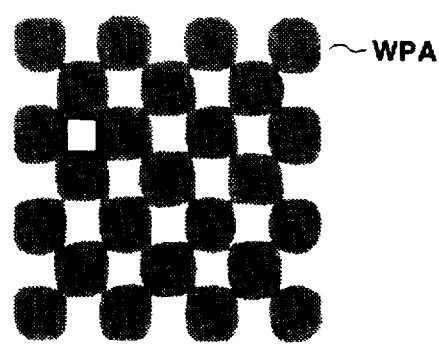
Figure 10:
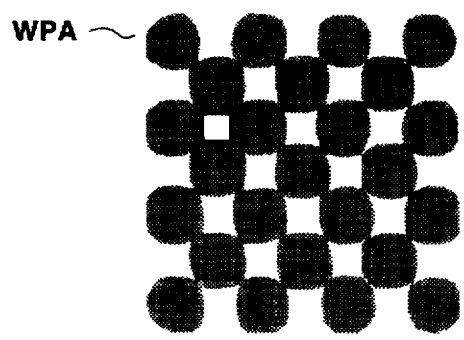
Figure 10:
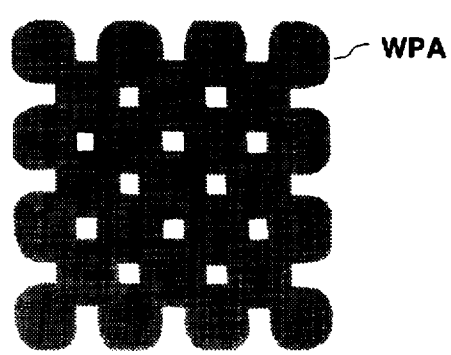

First, an objective mirror AMR or the objective mirror AML is moved to the position of a window for measurement (WIL shown in FIG. 7 or WIR (not shown)) provided on the reticle RT. If measurement is performed simultaneously using the two windows WIL and WIR, the processing time is reduced by ½. Hence, this approach is effective. No pattern is present in each of the windows. A mark observed through the window (WPA shown in FIG. 7) has the shape shown in FIG. 9(c). At that time, it is unnecessary to change the optical system. A method of measuring the mark will be described later.

All shots from the first shot to the final shot are sequentially inspected by performing step-and-repeat processing of the wafer by moving of the XY stage XYS (step S010). However, the movement of the stage during inspection is different from that during exposure. The XY stage XYS is moved by very small steps so that all inspection marks WPA, which are two-dimensionally arranged within the exposure region, can be observed through the window WIL. The measurement of one inspection mark is performed according to the following process.

First, the XY stage XYS is moved and positioned (step SB001) so that the image of the inspection mark WPA is received by the CCD camera CM, and the distance between the XY stage XYS and the projection lens LN is set to an optimum value by performing an autofocusing operation by image processing (step SB002). Then, an evaluation value e, obtained from the inspection mark WPA is measured by image processing, and is stored in the stepper control unit CU (step SB003). The stepper control unit CU then determines whether all the marks are measured (step SB004). If all the marks are not measured, the method returns to step SB001 and steps SB001 through SB004 are repeated for each mark. When all inspection marks WPA within the exposure region WFS have been observed, the next shot is inspected.

When the stepper control unit CU determines that all the shots and marks have been inspected in step SB004, the wafer WF which has been measured is conveyed from the wafer chuck WS to the conveying path R3 of the developing unit DE using the recovery hand HAR. Then, the wafer WF is conveyed to the path R4 without being developed by the developing unit DE, and is taken out to a wafer reception table WEN (step S011). The control of the first set of steps to the fourth set of steps is performed by the stepper control unit CU. Each unit and the stepper control unit CU is connected via a communication cable.

Thereafter, the best focus is estimated by the following method. That is, as described above, in exposing and printing the inspection pattern on each exposure region, the focus is changed stepwise for each exposure region. Hence, the curve shown in FIG. 11 is obtained by plotting the evaluation value of the inspection pattern, e, arranged at a particular position in each exposure region, for example, the center of the region, PE, against the focus, f, and the focus corresponding to the maximum value of the curve, is considered to be the best focus BF.

The inclination of the wafer WF during exposure can be measured from the distribution of respective evaluation values of all the inspection marks printed on the wafer WF. That is, the focus for each inspection mark is obtained from the evaluation value of the inspection mark. However, since it is impossible to determine whether the value is in the positive direction or in the negative direction with respect to the best focus BF, the determination is made from the behavior of a plurality of inspection marks at the same position within respective exposure regions for the focus of the inspection mark whose sign is to be determined.

FIG. 12(a) shows one exposure region at three different distances, f1, f2 and f3 from the projection lens LN. The exposure region is upwardly inclined in the rightward direction with respect to the best focus surface BF. FIG. 12(c) also shows one exposure region at three different distances, f1, f2 and f3, from the projection lens LN. The exposure region in this figure is downwardly inclined in the rightward direction with respect to the best focus surface, BF. Evaluation values at points P1 and P2 on the exposure region in FIG. 12(a) are computed and are shown in FIG. 12(b). Similarly, the evaluation values at the three different positions in FIG. 12(c) are computed and shown in FIG. 12(d). It can be understood that point P1 gradually approaches the best focus BF since the focus in the exposure region monotonically increases as it moves from f1 to f3 in the positive direction. Point P2 has a movement reverse to the above-described movement. Accordingly, it becomes clear that the focus increases in the case of point P1 and decreases in the case of point P2 as the exposure surface considered changes from f1 to f3.

Figure 13:
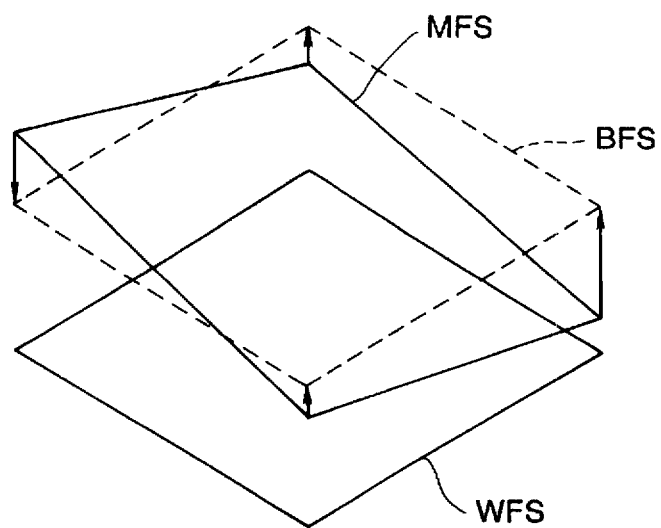
FIG. 13 is a schematic diagram illustrating the manner of obtaining the inclination of the focus in the present invention.

If two-dimensional focus values determined from evaluation values in the above-described manner are plotted, a plane MFS shown in FIG. 13 can be obtained. Parameters input to the apparatus as the amounts of movement of the stage for the purpose of measurement can be used for the positions of marks used for calculating the plane MFS. The plane MFS is inclined with respect to a best focus plane BFS within the exposure region. Accordingly, the amount of correction of the inclination needed so that the plane MFS becomes the plane BFS can be obtained by simple calculation. The obtained amount of correction is automatically input to the stepper control unit CU.

Thereafter, when exposing a production wafer, measured values obtained by the CCD of the focus sensor are automatically corrected based on the amount of correction stored in the stepper control unit CU (step S012).

In the foregoing description the influence of projections and recesses of a wafer is not considered. Actually, however, a wafer has projections and recesses. Hence, even if the positions of the wafer in the z direction and the inclination of the plane of projection of the inspection marks RP. i.e., the exposure region WFS are adjusted by an autofocusing operation, the entire region of the exposure focal plane is not always parallel to the exposure region. Accordingly, the curve illustrating the relationship between the focus value and the evaluation value shown in FIG. 12 is, in some cases, not smooth.

In the above-described focusing mechanism, the adjustment in the z direction and the inclination are obtained using a five-point sensor. In particular, the z direction is adjusted using an average of values of the sensor, or an assigned value produced by the sensor. Even if the exposure focal plane ES and the wafer surface WS are made parallel to each other, the same interval cannot, in some cases, be obtained at all positions in the exposure region due to small undulations in the wafer, as shown in FIG. 18(i). In such a case, a satisfactory exposure using a certain amount of change df in the focus cannot be realized. Accordingly, the curves shown in FIGS. 12(b) and 12(d) are distorted, and it is inaccurate to obtain the best focus BF from a graph obtained from one-dimensional measurement.

In order to improve accuracy in measurement, the above-described two-dimensional exposure is performed, respective inspection marks are measured, and processing is performed based on respective data obtained for the same target focus position.

In the two-dimensional exposure, an exposure operation performed while changing the exposure focus by df is repeated a plurality of times. After development, all marks are measured, and obtained results are plotted with taking target values in the z and x directions as the abscissa, and taking evaluation values as the ordinate, as shown in FIG. 17(c). The graphs shown in FIGS. 16(c) and 17(c) are obtained by plotting the results of measuring all the inspection marks after development,i.e., the evaluation value, against the exposure areas S1–S8 in which the measurements are taken. Thus, the abscissa represents the different exposure areas S1–S8 and the ordinate represents the evaluation value. In addition, superimposed on these graphs is the target value in the z axis direction, f. Also superimposed on FIGS. 16(c) and 17(c) are the graphs shown in FIGS. 16(b) and 17(b), respectively. The graph from FIG. 16(b) is shown in FIG. 16(c) in dashed lines, and the graph from FIG. 17(b) is shown in FIG. 17(c) in dashed lines. In data processing, an approximate curve is obtained from plotted data, and the peak of the curve is obtained.

The approximate curve may be obtained as a quadratic curve, a quartic curve, a hyperbola or the like so as to minimize least square errors. The curve minimizes the following expression:

$$\sum_{i=1}^{N} (f(i) - ei)^2, \quad (1)$$

N is the number of data, f is the expression of the curve to be fitted, and ei is a measured evaluation value. If the exposure focus is determined using the thus obtained best focus position, excellent exposure is performed. If focus positions of respective points within the exposure region are obtained by the above-described method, the inclination of the image can be exactly determined. The above-described approach, in which a plurality of shots are exposed for one focus, and a plurality of data are measured, is effective not only when small undulations are present on the wafer, but also when the wafer is flat, or is warped or has undulations or fine projections and recesses.

Figure 20:
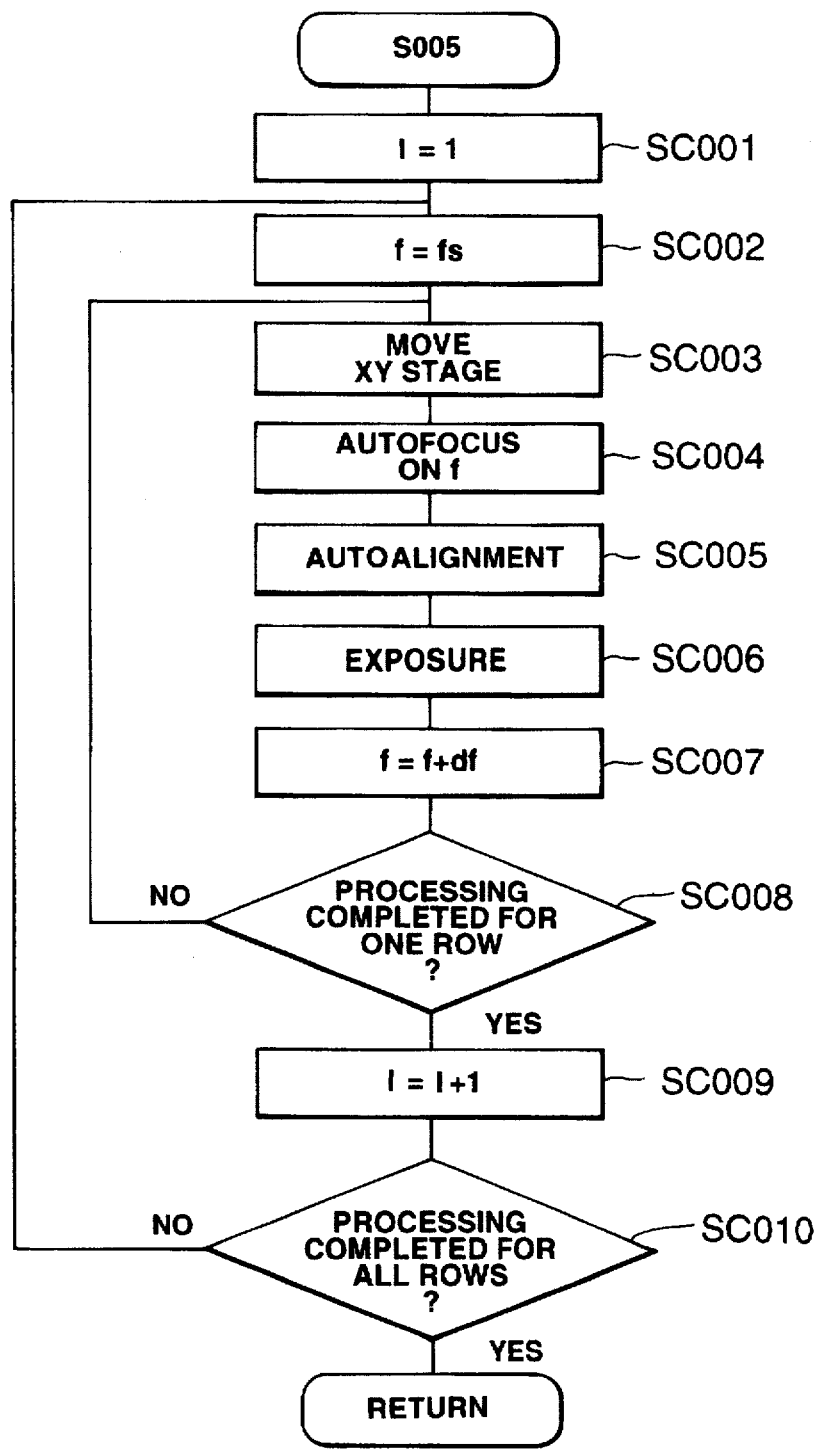
FIG. 20 is a flowchart of a method of exposing a wafer two-dimensionally.

Next, a description will be provided of a method for exposing a plurality of rows. Step S005 (the step-and-repeat processing of exposure) shown in FIG. 19 is replaced by the flowchart of FIG. 20. Since all exposed marks are measured, there is no modification in measurement. In order to sequentially expose the first row, 1, which represents the number of the row, is set to 1 (step SC001) and the target value f of the focus is set to an initial value fs (step SC002). The XY stage moves to the exposure position (step SC003), the target value of an autofocusing operation in the z direction is set to the value f, and the inclination of the image is adjusted (step SC004).

Next, alignment is automatically performed in order to exactly adjust the exposure position (step SC005), and exposure is then performed (step SC006). The target value of the focus for the next shot is changed by df (step SC007), and the stepper control unit CU determines whether the exposure and processing of one row is completed in step SC008. If the exposure and processing of one row is completed, the control unit CU adds 1 to 1 in step SC009. Next, in step SC010 the control unit CU determines whether the exposure and processing of all rows is completed. If not, the next row, 1+1, is exposed by initializing the target value of the focus to fs in step SC002 and repeating the steps SC003 through SC010. If the control unit CU determines in step SC008 that the processing is not completed for one row, steps SC003 through SC008 are repeated. If the control unit CU determines is step SC010 that processing of all rows is completed, the process returns to step S006 in FIG. 4.

Next, a description will be provided of a method of forming inspection marks with reference to FIGS. 8(a) through 10(f). Wafers which have passed through several processes in the manufacture of semiconductor devices are used as wafers to be inspected. Alternatively, inspection wafers having the same inspection process as the current inspection process are used. A region having a known structure and pattern arrangement and having no projections and recesses, such as an interconnection region, or the like, within the shot is used as a portion on which an inspection pattern is exposed.

Figures 8A, 8B:
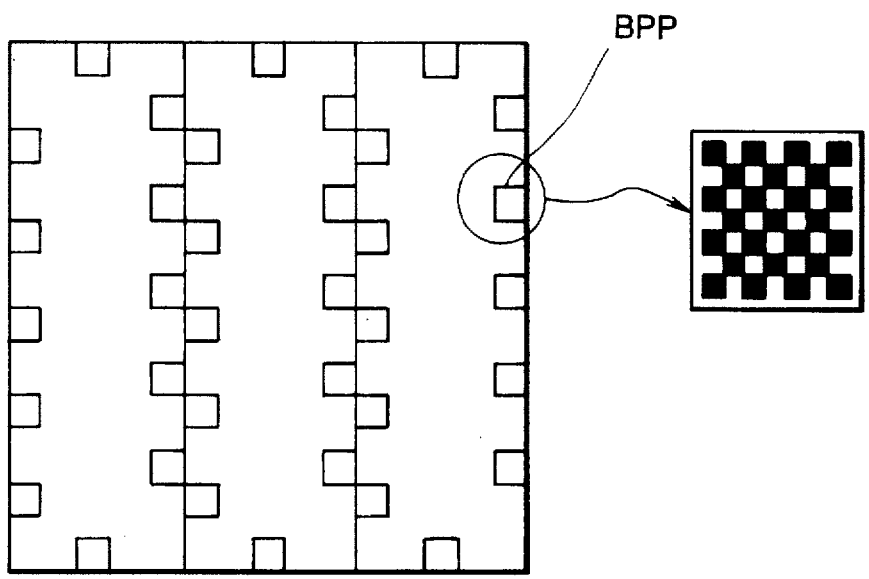
FIGS. 8(a) is a schematic top view of a portion of the wafer.
FIG. 8(b) is a schematic enlarged top view of a square bonding pad portion of the wafer.

FIG. 8(a) illustrates a state of the wafer in which three chips are formed within the exposure region. For example, as shown in FIG. 8(a), a square bonding pad portion (BPP), provided at the circumference of each semiconductor chip, for connecting the chip to leads may be utilized as a portion to expose the inspection pattern. No projections and recesses are present in the BPP throughout the entire process of manufacturing semiconductor devices. An inspection pattern as shown in FIG. 8(b) is formed on the BPP. When forming a plurality of semiconductor chips within a region which can be simultaneously exposed at one time, bonding pads are suitable for measuring the surface shape because they are arranged two-dimensionally within the exposure region.

In the present embodiment, a state in which the resist RE is coated on the wafer WF in a first step is shown in FIG. 9(a). In a second step, the pattern shown in the cross-sectional view of the resist RE and the wafer WF in FIG. 8(b) depicted on the reticle RT is exposed to radiation and projected onto the layer of the resist RE. In a third step, the resist RE is developed, as shown in the cross-sectional view of the wafer WF and the resist RE in FIG. 9(b) and in the top view of the wafer WF seen in FIG. 9(c). In FIG. 9(c), painted portions RER represent regions where the resist RE remains after development.

The image taken by the CCD camera CM in a fourth step for measuring the focus is as shown in FIG. 9(c). After the image has been processed within the stepper control unit CU, a differential image as shown in FIG. 9(d) is obtained. The image shown in FIG. 9(d) is obtained by differentiating the image shown in FIG. 9(c) in the vertical and horizontal directions, and taking the absolute values of the differentiated values according to the equation for the contrast of the signal, Con(x,y):

$$\mathrm{Con}(x,y) = |f(x-1,y) - f(x+1,y)| + |f(x,y-1) - f(x,y+1)|$$

This expression expresses the differentiation of the image signal. The function f(x,y) represents the value of a pixel at coordinates (x,y). Consequently, f(x−1,y) represents the value of a pixel at coordinates (x−1,y); f(x+1,y) represents the value of a pixel at coordinates (x+1,y); f(x,y−1) represents the value of a pixel at coordinates (x,y−1); and f(x,y+1) represents the value of a pixel at coordinates (x,y+1). The first term represents the absolute value of the differential value in the horizontal direction, and the second term represents the absolute value of the differential value in the vertical direction. The function Con(x,y) represents the addition of the absolute values of the differential values in the vertical and horizontal directions, and represents the contrast at the coordinates (x,y). A pixel having a large value of Con(x,y) indicates that the position of the pixel corresponds to an edge of the image. Symbol EG shown in FIG. 9(d) represents an edge of an image, symbol SGX represents the value of Con(x,y) at a given point in the x-axis direction, and symbol SGY represents the value of Con(x,y) at a given point in the y-axis direction. Thus, the graph below the grid pattern shown in FIG. 9(d) represents the value SGX at different points along the x-axis and the graph to the right of the grid shows the value of SGY at different points along the y-axis.

A grid-like pattern shown in FIG. 10(a) is used as the inspection pattern. FIG. 10(a) illustrates a top view of a reticle pattern RP. The reticle pattern RP is transferred onto the resist RE on the wafer WF. The two-dimensional grid-like pattern is provided for the following reason. That is, when the pattern is defocused, adjacent grid portions adjacent the developed resist pattern overlap with each other, and the area of the overlapped portions increases or decreases in accordance with the amount of the defocus.

This behavior will be described with reference to FIGS. 9(c) through 9(g). FIG. 9(c) illustrates a resist image after development in the case of the best focus. FIG. 9(d) illustrates an image obtained by differentiating values representing the image shown in FIG. 9(c) and illustrates the values of the contrast of the image in the x and y directions representing the differential image. FIG. 9(f) illustrates an image of the resist taken by the CCD camera CM after development in a defocused state. FIG. 9(g) illustrates an image obtained by differentiating the values pf the image shown in FIG. 9(f). FIG. 9(g) also shows two graphs showing the value of SGX at points along the x axis and showing the value of SGY at points along the y axis. In FIG. 9(f), adjacent grid portions overlap with each other in the defocused state. Hence, the size of the edge portions in the differential image is smaller than in the case of the best focus.

That is, the size of the edges in the grid pattern is small in a defocused state, and is large in the case of the best focus because the pattern is exactly transferred. The size of edges will be quantified according to the following method, and the best focus value will be obtained.

A description will now be provided of a method of quantitatively evaluating the inspection pattern. The evaluation value is obtained from the differential value and a histogram of the signal taken by the CCD camera CM. FIG. 9(e) illustrates a differential histogram of the differential values shown in FIG. 9(d), and FIG. 9(h) illustrates a differential histogram of the differential values shown in FIG. 9(g). The area of an upper region delimited by a preset threshold TH is calculated from the histogram, and is made to be the evaluation value for the contrast. That is, in the state of the best focus, the size of edge portions is large, so that the area of the upper region (BS shown in FIG. 9(e)) of the histogram is large. In a defocused state, the size of edge portions is small, so that the area of the upper region (DS shown in FIG. 9(h)) is small.

The image WPA of an inspection mark present at the center or a predetermined point of each shot exposed while changing the focus value in the second step changes as shown in FIGS. 10(b), 10(c), 10(d), 10(e) and 10(f). FIGS. 10(b) and 10(c) show a negative defocus of the image WPA, FIG. 10(d) shows the best focus, and FIGS. 10(e) and 10(f) show a positive defocus of the image WPA. FIG. 11 is obtained by plotting the results of the evaluation by the differential histogram. The focus during exposure corresponding to the maximum value PE is the best focus BF. When the images of the pattern shown in FIGS. 10(b) through 10(f) are taken by the CCD camera CM, an image autofocusing (image AF) operation is performed for each image.

Next, a description will be provided of the autofocusing (image AF) operation performed via image processing. A focus inspection mark, which is not a dedicated mark for the image AF, is used for the image AF. Accordingly, in order to obtain the optimum height of the stage for obtaining the image, i.e., the best focus for the image, an evaluation function, which quantifies the degree of defocus of the image by image processing using, for example, the contrast of the image, is used. The optimum focus for the image is determined by obtaining the image while displacing the XY stage XYS in the direction of its height, plotting evaluation values of the evaluation function at that time within the stepper control unit CU, and obtaining the height of the stage corresponding to the highest evaluation value. By adding the image AF function, accuracy in measurement when inspecting a mark is improved, and the stability of the measurement is increased.

By using the above-described inspection process, self inspection of a reduction-projection exposure apparatus may be performed. The evaluation of a projection lens, which has conventionally been performed by vernier evaluation by an inspection operator, is replaced by the automatic inspection process of the present embodiment in all processes of resist coating, exposure, development and inspection.

Next, a description will be provided of a second embodiment of the present invention.

In the above-described first embodiment, a reticle having an open window is used for evaluating an inspection mark within the exposure region, and the apparatus is controlled so that the mark is present under the window by moving the XY stage XYS. When a substrate having no pattern on its entire surface, such as a glass plate, or the like, is used as the reticle, the focus and the amount of inclination of the plane of projection of an image of the inspection mark of the reticle, i.e., the exposure region of the wafer can be measured also by an apparatus shown in FIGS. 14(a) and 14(b).

Figure 14A:
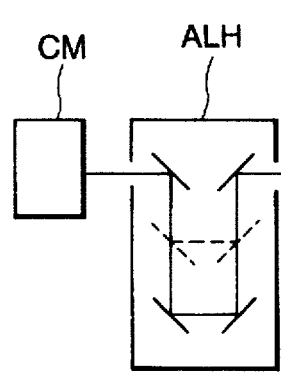
FIG. 14(a) is a schematic side view and FIG. 14(b) is a schematic top view illustrating the configuration of a principal portion of a semiconductor device manufacturing apparatus according to a second embodiment of the present invention.
Figure 14B:
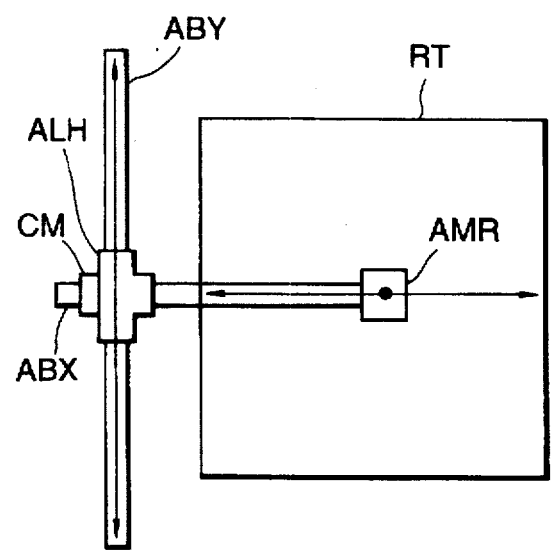

FIGS. 14(a) and 14(b) illustrate a structure in which an objective mirror AMR mounted on an alignment scope can be moved to an arbitrary point on a reticle RT. In the structure shown in FIGS. 14(a) and 14(b), the objective mirror AMR is mounted on a distal end of an x-axis moving mechanism ABX, and the objective mirror AMR can be moved to an arbitrary position on the x axis by driving the x-axis moving mechanism ABX. The x-axis moving mechanism ABX is mounted on a y-axis moving mechanism ABY, and the entire x-axis moving mechanism ABX can move to an arbitrary point on the y axis. The objective mirror AMR can be moved to an arbitrary position on the reticle RT by the x-axis moving mechanism ABX and the y-axis moving mechanism ABY.

By changing the position of the objective mirror AMR, the length of the optical path to the CCD camera CM is changed. Accordingly, an optical-path-length correction mechanism ALH is disposed on the x-axis moving mechanism ABX as the correction mechanism for the optical length. The principle of the optical-path-length correction mechanism ALH is as follows. That is, when the objective mirror AMR is extended away from x-axis moving mechanism ABX, a mirror incorporated in the optical-path-length correction mechanism ALH moves upward to shorten the length of the optical path within the optical-path-length correction mechanism ALH. On the other hand, when the objective mirror AMR approaches the x-axis moving mechanism ABX, the mirror within the optical-path-length correction mechanism ALH moves downward to lengthen the length of the optical path.

That is, by linking the mirror within the optical-path-length correction mechanism ALH with with the x-axis moving mechanism ABX, the length of the optical path to the CCD camera CM is always kept constant. Since the optical-path-length correction mechanism ALH and the CCD camera CM are mounted on the y-axis moving mechanism ABY, it is unnecessary to perform correction for the movement in the y-axis direction.

It is possible to observe a plurality of evaluation marks WPA within the exposure region and to receive images using this mechanism. The present embodiment using this mechanism can be executed by the same approach as in the first embodiment from the first set of steps to the third set of steps. The same approach as in the first embodiment can also be adopted for the calculation of the focus and the amount of correction of the inclination of the focus in the fourth step.

Figure 15:
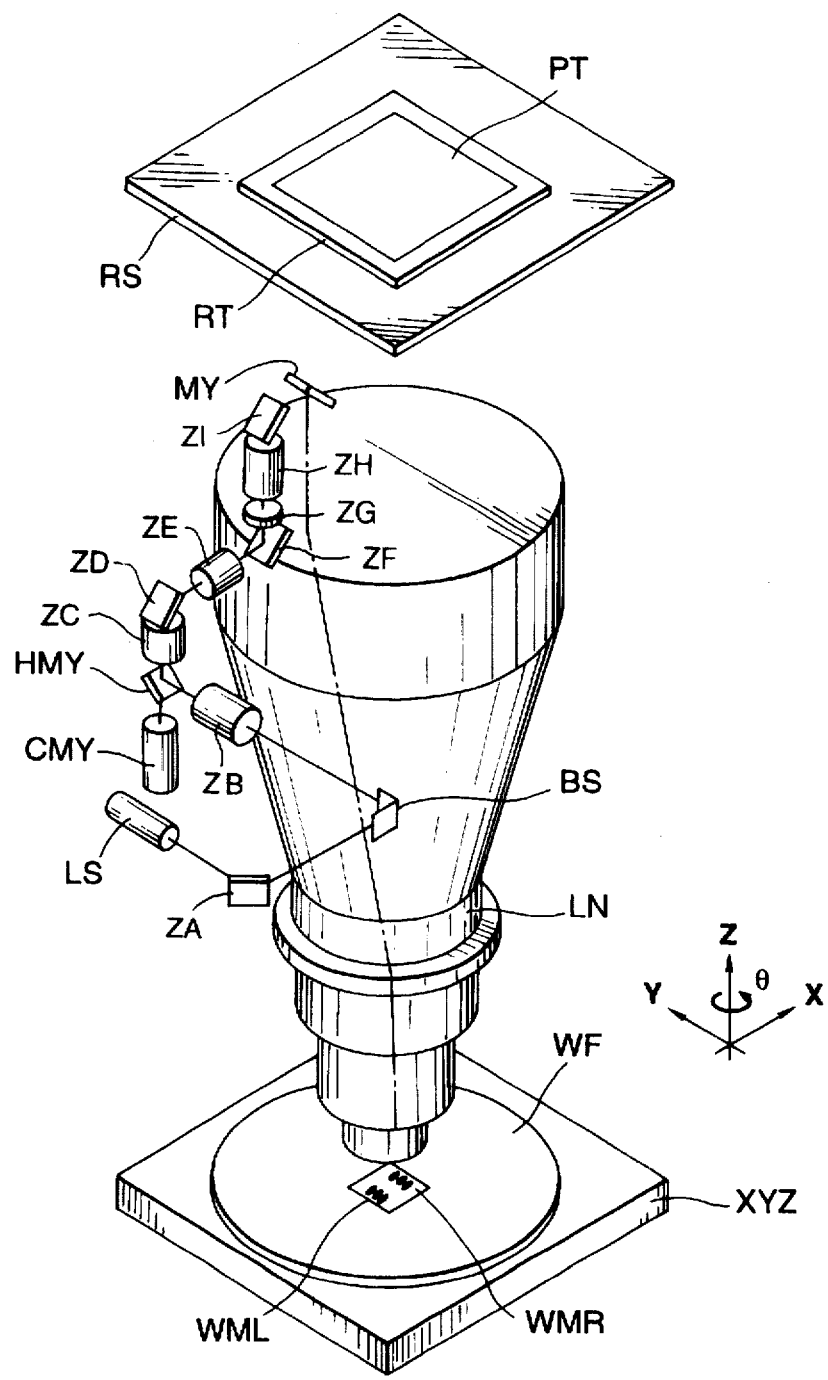
FIG. 15 is a schematic diagram illustrating the configuration of a principal portion of a semiconductor device manufacturing apparatus according to a third embodiment of the present invention.

FIG. 15 is a diagram illustrating the schematic configuration of a principal portion of a semiconductor-device manufacturing apparatus according to a third embodiment of the present invention. Reference letters in FIG. 15 that are also found in FIG. 1 denote the same elements.

The apparatus of the present embodiment includes an alignment mechanism of a TTL (through-the-lens) system, in which alignment is performed without passing light through a reticle, and can automatically measure the image of a mark for measuring the amount of deviation. The present embodiment can be executed by the same approach as in the first embodiment from the first set of steps to the third set of steps. Hence, a description thereof will be omitted. However, the measurement of the alignment mark in the second set of steps may be performed utilizing a TTL measurement mechanism shown in FIG. 15. In this case, exposure is performed by global alignment.

A scope for alignment for measuring a mark for focus inspection in the fourth set of steps is always placed at a fixed position. When a circuit pattern depicted on a reticle RT is exposed to radiation and projected onto a wafer WF, a mirror MT for projecting illuminating light from the alignment mark onto a projection lens LN is set at a position where exposure light is not blocked.

Next, a description will be provided of a method of receiving the image of a mark for focus inspection using the alignment scope. Since the alignment mechanism is fixed, the inspection mark is observed by controlling the position of the XY stage XYS which mounts an inspection wafer. For example, each of marks WML and WMR within the same shot shown in FIG. 15 is moved under the scope by the interval between the marks by moving the XY stage XYS by controlling the movement of a motor (not shown). A laser beam for illuminating the mark emitted from a laser LS passes through a prism ZA, a prism BS, a lens ZB, is reflected by a mirror HMY, passes through a lens ZC, is reflected by a mirror ZD, passes through a lens ZE, is reflected by a mirror ZF, passes through lenses ZG and ZH, and is reflected by mirrors ZI and MY, and is projected into the projection lens LN to illuminate the inspection mark WMR formed on the wafer WF.

The laser light is reflected by the mark and an image of the mark enters the alignment optical system after passing through the projection lens LN and being reflected by the mirror MY, and is focused onto a CCD camera CMY. The image of the inspection mark received by the CCD camera CMY is processed by a stepper control unit CU, and evaluation values are stored. The movement of the stage, the reception of the image, and the processing of the received image are performed for all inspection marks by step-and-repeat processing as in the first embodiment. After the final mark has been measured, the wafer WF is taken out of the stage by a recovery hand HAR shown in FIG. 1.

Thereafter, the wafer WF is processed in the same manner as in the first embodiment. The focus evaluation values stored in the stepper control unit CU are also processed in the same manner as in the first embodiment, and are automatically input to the stepper as a focus offset and the amount of correction of the inclination of the plane of projection of an image of the inspection mark of the reticle, i.e., the exposure region of the wafer.

Next, a description will be provided of a fourth embodiment of the present invention. In the present embodiment, it is possible to perform automatic measurement using an alignment mechanism with an off-axis method, in which alignment is performed without passing light through a projection lens LN. The present embodiment will be described illustrating the semiconductor-device manufacturing apparatus shown in FIG. 1. The present embodiment can also be executed by the same approach as in the first embodiment from the first set of steps to the third set of steps. Hence, a description thereof will be omitted. However, the measurement of the alignment mark in the second step may be performed utilizing a measurement mechanism using an off-axis alignment scope. In this case, exposure is performed by global alignment.

A scope OE for off-axis alignment for measuring marks for inspecting the amount of exposure and the exposure focus in the fourth set of steps is always placed at a fixed position. A description will be provided of a method of receiving the image of a mark for measuring the amount of deviation using the alignment scope OE. Since the alignment mechanism is fixed, the inspection mark is observed by controlling the position of the XY stage XYS which mounts the inspection wafer. The alignment scope OE comprises a light source for observing the mark, a microscope and a CCD camera. The image of the mark on the inspection wafer illuminated by light emitted from the light source is magnified by the microscope, and is focused onto the CCD camera CM.

The image received by the CCD camera CM is processed by the stepper control unit CU, and evaluation values are obtained from the mark. All evaluation marks are stored in the stepper control unit CU. The movement of the stage, the reception of images, and the processing of the received images are performed for all inspection marks by step-and-repeat processing. After the final mark has been measured, the wafer is taken out of the stage using the recovery hand HAR.

Thereafter, the wafer is processed in the same manner as in the first embodiment. The focus evaluation values stored in the stepper control unit CU are also processed in the same manner as in the first embodiment, and are automatically input to the stepper as a focus offset and the amount of correction of the inclination of the plane of projection of an image of the inspection mark of the reticle, i.e., the exposure region of the wafer.

In the foregoing description, the alignment between the reticle and the stage is performed in the second step. However, if accuracy in alignment is not required, exposure may be performed without performing alignment.

In the above-described approaches of using the alignment mechanism of the TTL method in which alignment is performed without passing light through the reticle, and the off-axis method, it becomes unnecessary to provide a window for observing a mark on a reticle, and the area occupied by a reticle pattern required for automatic measurement can be reduced.

So far, a description has been provided assuming that the inspection mark is provided on a flat region, for example, a bonding pad portion. If such a region cannot be used, a reticle having particular inspection marks may not be used, but a reticle for manufacturing semiconductor devices may be used without modification. That is, it is also possible to use a dot pattern, such as a contact hole. In this case, since the direction and the position of the pattern is known when designing the reticle, the position and the direction of the inspection pattern may be input to the stepper as parameters by a simple operation.

As the light source LS for observing marks in the above-described first and second embodiments, a light source which is similar to exposure light, such as a He—Cd laser, the g-line of an ultra-high pressure mercury lamp, or the like, may not be used, but non-exposure light, such as a He—Ne laser, or the like, may be used. In such a case, an optical system for correcting chromatic aberration is inserted between the prism BS and the set mark RSML.

The functions shown in the above-described embodiments can be applied not only to a reduction projection exposure apparatus, such as a stepper, or the like, but also to an exposure apparatus having a measuring optical system for alignment.

As described above, according to the present invention, an automatic measurement system relating to the focus and the inclination of the focus is configured by peripheral equipment comprising a stepper, serving as an exposure apparatus, a coater and a developer. Hence, accuracy in measurement is improved and the inspection time is reduced compared with a conventional wafer inspection operation performed by an operator. In addition, inspection conditions and accuracy in measurement can be stabilized. That is, the present invention is effective for improving the efficiency and the production yield in the manufacture of semiconductor devices.

The individual components shown in outline or designated by blocks in the drawings are all well known in the projection exposure method and semiconductor device manufacturing method arts and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for manufacturing semiconductor devices comprising the steps of:

exposing a pattern for focus measurement, formed on a surface of a reticle and comprising a two-dimensional grid pattern, to radiation and projecting the pattern for focus measurement onto a plurality of regions of an inspection wafer at different focal positions of the wafer, on which a resist has been coated by a resist coating apparatus, using a projection exposure apparatus;

developing the two-dimensional grid pattern for focus measurement projected on the inspection wafer in the plurality of regions with a developing apparatus;

imaging with the projection exposure apparatus, the developed two-dimensional grid pattern in the plurality of regions to produce pixels of the developed two-dimensional grid pattern in each region, wherein f(x,y) represents the value of a pixel of the developed two-dimensional grid pattern in each region at coordinate (x,y), f(x−1,y) represents the value of a pixel of the developed two-dimensional grid pattern in each region at coordinate (x−1,y), f(x+1,y) represents the value of a pixel of the developed two-dimensional grid pattern in each region at coordinate (x+1,y), f(x,y−1) represents the value of a pixel of the developed two-dimensional grid pattern in each region at coordinate (x,y−1), and f(x,y+1) represents the value of a pixel of the developed two-dimensional grid pattern in each region at coordinate (x,y+1);

producing image signals representing the imaged developed two-dimensional grid pattern in each region;

differentiating the image signals representing the imaged, developed two-dimensional grid pattern in each region to calculate the contrast of the imaged, developed two-dimensional grid pattern in each region to produce differential values of the image signals according to the equation;

$$Con(x,y) = |f(x-1,y) - f(x+1,y)| + |f(x,y-1) - f(x,y+1)|;$$

determining a differential histogram of the differential values for each region by calculating the frequency of occurrence of different differential values in each region, calculating the area of the histogram for each region above a predetermined differential value threshold, and defining an evaluation value for the contrast of the developed two-dimensional grid pattern for each region at different focal positions of the inspection wafer as the area of the histogram from that region above the predetermined differential value threshold;

determining the best focus position and the inclination of the plane of projection of the image of the pattern for focus measurement of the reticle by the distribution of evaluation values of the pattern with respect to the different focal positions of the wafer;

calculating a focus offset from the determined best focus position and an amount of correction of the inclination of the plane of projection from the determined inclination of the plane of projection of the image of the pattern for focus measurement of the reticle;

setting the focus offset and the amount of correction of the inclination of the plane of projection; and coating the surface of a wafer with resist using the resist coating apparatus, exposing a pattern formed on the surface of the reticle to radiation and projecting the pattern onto the resist on the surface of the wafer using the projection exposure apparatus and using the set focus offset and amount of correction of the inclination of the plane of projection, and developing the resist using the developing apparatus.

2. A projection exposure method comprising the steps of:

forming on a surface of image pickup means an image of a mark on a surface of a reticle and an image of a mark on a surface of a wafer;

aligning the reticle and the wafer relative to each other with an alignment mechanism using image information obtained from the image pickup means;

exposing a plurality of patterns for focus measurement, each comprising a two-dimensional grid pattern, on the surface of the reticle to radiation and projecting an image of the plurality of patterns for focus measurement onto a resist coated on the surface of the aligned wafer in a plurality of regions and different focal positions of the wafer;

imaging the plurality of two-dimensional grid patterns in the plurality of regions to produce pixels of the plurality of two-dimensional grid patterns in each region, wherein f(x,y) represents the value of a pixel of each of the two-dimensional grid patterns in each region at coordinate (x,y), f(x−1,y) represents the value of a pixel of each of the two-dimensional grid patterns in each region at coordinate (x−1,y), f(x+1,y) represents the value of a pixel of each of the two-dimensional grid patterns in each region at coordinate (x+1,y), f(x,y−1) represents the value of a pixel of each of the two-dimensional grid patterns in each region at coordinate (x,y−1), and f(x,y+1) represents the value of a pixel of each of the two-dimensional grid patterns in each region at coordinate (x,y+1);

producing image signals representing the plurality of imaged two-dimensional grid patterns in each region;

differentiating the image signals representing the plurality of imaged two-dimensional grid patterns in each region to calculate the contrast of each of the plurality of imaged two-dimensional grid patterns in each region to produce differential values of the image signals according to the equation;

$$Con(x,y)=|f(x-1,y)-f(x+1,y)|+|f(x,y-1)-f(x,y+1)|;$$

determining a differential histogram of the differential values for each region by calculating the frequency of occurrence of different differential values in each region, calculating the area of the histogram for each region above a predetermined differential value threshold, and defining an evaluation value for the contrast of the developed two-dimensional grid pattern for each region at different focal positions of the wafer as the area of the histogram from that region above the predetermined differential value threshold;

determining a best focus position of the wafer and the inclination of the plane of projection of an image of the plurality of two-dimensional grid patterns for focus measurement of the reticle projected onto the wafer to form the plurality of two-dimensional grid patterns for focus measurement provided on the surface of the wafer by determining the distribution of evaluation values with respect to the different focal positions of the wafer.

3. A projection exposure method according to claim 2, said measuring step comprising the steps of illuminating the plurality of patterns for focus measurement and switching the illuminating of the plurality of patterns for focus measurement between exposure light which exposes the resist, and non-exposure light which does not expose the resist.

4. A projection exposure method according to claim 2, further comprising the step of controlling the position of the wafer by detecting the best focus position from the sharpness of the pattern for focus measurement provided on the surface of the wafer on the surface of the image pickup means.

5. A projection exposure method comprising the steps of:

forming images of marks on a surface of a wafer on a surface of image pickup means;

aligning the wafer and the image pickup means relative to each other with an alignment mechanism using image information obtained from the image pickup means;

exposing a plurality of patterns for focus measurement of a reticle, each comprising a two-dimensional grid pattern, to radiation and projecting an image of the plurality of patterns for focus measurement onto a resist coated on the surface of the aligned wafer in a plurality of regions at different focal positions of the wafer;

imaging the plurality of two-dimensional grid patterns in the plurality of regions to produce pixels of the plurality of two-dimensional grid patterns in each region, wherein f(x,y) represents the value of a pixel of each of the two-dimensional grid patterns in each region at coordinate (x,y), f(x−1,y) represents the value of a pixel of each of the two-dimensional grid patterns in each region at coordinate (x−1,y), f(x+1,y) represents the value of a pixel of each of the two-dimensional grid patterns in each region at coordinate (x+1,y), f(x,y−1) represents the value of a pixel of each of the two-dimensional grid patterns in each region at coordinate (x,y−1), and f(x,y+1) represents the value of a pixel of each of the two-dimensional grid patterns in each region at coordinate (x,y+1);

producing image signals representing the plurality of imaged two-dimensional grid patterns in each region;

differentiating the image signals representing the plurality of imaged two-dimensional grid patterns in each region to calculate the contrast of each of the plurality of imaged two-dimensional grid patterns in each region to produce differential values of the image signals according to the equation:

$$Con(x,y)=|f(x-1,y)-f(x+1,y)|+|f(x,y-1)-f(x,y+1)|;$$

determining a differential histogram of the differential values for each region by calculating the frequency of occurrence of different differential values in each region, calculating the area of the histogram for each region above a predetermined differential value threshold, and defining an evaluation value for the contrast of the developed two-dimensional grid pattern for each region at different focal positions of the wafer as the area of the histogram from that region above the predetermined differential value threshold; and determining a best focus position of the wafer and the inclination of the plane of projection of an image of the plurality of patterns for focus measurement of the reticle projected onto the wafer to form the plurality of two-dimensional grid patterns for focus measurement provided on the surface of the wafer by determining the distribution of the evaluation values with respect to the different focal positions of the wafer.

6. A projection exposure method according to claim 5, said measuring step comprising the steps of illuminating the plurality of patterns for focus measurement and switching the illuminating of the plurality of patterns for focus measurement between exposure light which exposes the resist, and non-exposure light which does not expose the resist.

7. A projection exposure method according to claim 5, further comprising the step of controlling the position of the wafer by detecting the best focus position from the sharpness of the pattern for focus measurement provided on the surface of the wafer on the surface of the image pickup means.

* * * * *

UNITED STATES PATENT AND TRADEMARK OFFICE
CERTIFICATE OF CORRECTION

PATENT NO. : 5,747,202

DATED : May 5, 1998

INVENTOR(S) : Hiroshi TANAKA

It is certified that error appears in the above-identified patent and that said Letters Patent is hereby corrected as shown below:

COLUMN 1:

Line 28, "has-increased" should read --has increased--.

COLUMN 5:

Line 35, "9(b)" should read --9(b) are--.

COLUMN 7:

Line 28, "of device" should read --device--.

UNITED STATES PATENT AND TRADEMARK OFFICE
CERTIFICATE OF CORRECTION

PATENT NO. : 5,747,202

DATED : May 5, 1998

INVENTOR(S) : Hiroshi TANAKA

It is certified that error appears in the above-identified patent and that said Letters Patent is hereby corrected as shown below:

COLUMN 8:

Line 46, ".., In" should read --... In-- and "are" should read --area--.
    Line 54, "A3,...," should read --A3, ....--.

COLUMN 15:

Line 40, "with" (second occurrence) should be deleted.

COLUMN 18:

Line 54, "imaged" should read --imaged,--.
    Line 61, "equation;" should read --equation:--.

COLUMN 19:

Line 67, "equation;" should read --equation:--.

UNITED STATES PATENT AND TRADEMARK OFFICE
CERTIFICATE OF CORRECTION

PATENT NO. : 5,747,202

DATED : May 5, 1998

INVENTOR(S) : Hiroshi TANAKA

It is certified that error appears in the above-identified patent and that said Letters Patent is hereby corrected as shown below:

COLUMN 20:

Line 12, "threshold;" should read --threshold; and--.
　　Line 34, "of;" should read --of:--.

Signed and Sealed this

Seventh Day of September, 1999

Q. TODD DICKINSON

Attest:

Attesting Officer　　Acting Commissioner of Patents and Trademarks

UNITED STATES PATENT AND TRADEMARK OFFICE
CERTIFICATE OF CORRECTION

PATENT NO.      : 5,747,202
DATED           : May 5, 1998
INVENTOR(S)     : Hiroshi Tanaka It is certified that error appears in the above-identified patent and that said Letters Patent is hereby corrected as shown below:

Title page,
Item [54] Title,

"PROJECTION EXPOSURE METHOD" should read -- METHOD OF MANUFACTURING SEMICONDUCTOR DEVICES AND A PROJECTION EXPOSURE METHOD COMPRISING THE STEPS OF EXPOSING A TWO-DIMENSIONAL GRID PATTERN OR PATTERNS ONTO A WAFER AT DIFFERENT FOCAL POSITIONS THEREOF --.

Column 1,
Line 28, "has-increased" should read -- has increased --.

Column 5,
Line 35, "9(b)" should read -- 9(b) are --.

Column 7,
Line 28, "of device" should read -- device --.

Column 8,
Line 46, ".., In" should read -- ... In -- and "are" should read -- area --.
Line 54, "A3,...," should read -- A3, .... --.

Column 15,
Line 40, "with" (second occurrence) should be deleted.

Column 18,
Line 54, "imaged" should read -- imaged, --.
Line 61, "equation;" should read -- equation: --.

Column 19,
Line 37, "equation;" should read -- equation: --.

UNITED STATES PATENT AND TRADEMARK OFFICE
CERTIFICATE OF CORRECTION

PATENT NO. : 5,747,202
DATED : May 5, 1998
INVENTOR(S) : Hiroshi Tanaka

It is certified that error appears in the above-identified patent and that said Letters Patent is hereby corrected as shown below:

Column 20,
Line 12, "threshold;" should read -- threshold; and --.
Line 34, "of;" should read -- of: --.

Signed and Sealed this

Second Day of April, 2002

Attest:

JAMES E. ROGAN
Attesting Officer    Director of the United States Patent and Trademark Office